United States Patent
Usami

(10) Patent No.: US 10,401,565 B2
(45) Date of Patent: Sep. 3, 2019

(54) SEMICONDUCTOR DEVICE AND METHOD OF MANUFACTURING THE SAME

(71) Applicant: Renesas Electronics Corporation, Tokyo (JP)

(72) Inventor: Tatsuya Usami, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 3 days.

(21) Appl. No.: 15/977,479

(22) Filed: May 11, 2018

(65) Prior Publication Data

US 2018/0372950 A1 Dec. 27, 2018

(30) Foreign Application Priority Data

Jun. 23, 2017 (JP) ................. 2017-123611

(51) Int. Cl.
    *G02B 6/12* (2006.01)
(52) U.S. Cl.
    CPC ...... *G02B 6/12* (2013.01); *G02B 2006/12061* (2013.01); *G02B 2006/12083* (2013.01); *G02B 2006/12166* (2013.01)
(58) Field of Classification Search
    CPC ............ G02B 6/12; G02B 2006/12061; G02B 2006/12083; G02B 2006/12166
    USPC .......................................................... 385/131
    See application file for complete search history.

(56) References Cited

U.S. PATENT DOCUMENTS

| 2010/0119231 A1* | 5/2010 | Kim ................. G02B 6/1221 398/82 |
| 2013/0334529 A1* | 12/2013 | Kaneko ............ H01L 27/0255 257/43 |
| 2014/0345517 A1* | 11/2014 | Liu .................. G02B 6/122 117/95 |
| 2015/0145009 A1* | 5/2015 | Namioka .......... H01L 27/10814 257/296 |

OTHER PUBLICATIONS

Andy Eu-Jin Lim et al., "Review of Silicon Photonics Foundry Efforts", IEEE Journal of Selected Topics in Quantum Electronics, Jul./Aug. 2014, vol. 20, No. 4.

* cited by examiner

*Primary Examiner* — Jerry M Blevins
(74) *Attorney, Agent, or Firm* — McDermott Will & Emery LLP

(57) ABSTRACT

An object of the present invention is to reduce the manufacturing cost of a semiconductor device. A semiconductor device includes a SOI substrate that has an optical waveguide including a semiconductor layer. The optical waveguide is covered with an interlayer insulating film. Wiring parts are formed on the interlayer insulating film. Moreover, a thin film part having a smaller thickness than the wiring parts is formed above the optical waveguide and is integrated with the wiring parts.

20 Claims, 19 Drawing Sheets

ND METHOD
SEMICONDUCTOR DEVICE AND METHOD OF MANUFACTURING THE SAME

CROSS-REFERENCE TO RELATED APPLICATIONS

The disclosure of Japanese Patent Application No. 2017-123611 filed on Jun. 23, 2017 including the specification, drawings and abstract is incorporated herein by reference in its entirety.

The present invention relates to a semiconductor device and a method of manufacturing the same and is properly usable for, for example, a semiconductor device having an optical device in a semiconductor chip and a method of manufacturing the same.

BACKGROUND

In recent years, so-called silicon photonics technology has been actively developed in which an optical-signal transmission line made of silicon (Si) is formed on a part of a semiconductor substrate. The semiconductor substrate is implemented as an optical communication module by integrating an optical device and an electron device, respectively including the transmission line.

Such a semiconductor device may include an optical-signal transmission line that has an optical waveguide composed of a semiconductor layer formed on a substrate with an insulating layer interposed between the semiconductor layer and the substrate, and has an insulating film formed over the optical waveguide on the insulating layer. The insulating layer and the insulating film are made of materials having a lower index of refraction than the semiconductor layer. Thus, the semiconductor layer acts as a core layer while the insulating layer and the insulating film act as clad layers. A semiconductor device including a silicon optical waveguide formed on a part of a semiconductor substrate is advantageous in that power consumption is quite low and an optical communication module can be implemented in a small size by forming a silicon integrated circuit and the optical waveguide on the same silicon substrate.

In Andy Eu-Jin Lim et al., "Review of Silicon Photonics Foundry Efforts" IEEE Journal of selected Topics in Quantum Electronics Vol. 20. No. 4 July/August 2014, a semiconductor device is described in which a heater is formed above an optical waveguide formed on a part of a semiconductor substrate, the heater including a titanium nitride (TiN) film on an insulating film covering the optical waveguide.

SUMMARY

The present inventors have examined the shortening of the process of forming a heater in a semiconductor device including a semiconductor substrate where an optical waveguide is formed, and a method of manufacturing the same.

The semiconductor device and the method of manufacturing the same are devised so as to reduce the manufacturing cost of the semiconductor device.

Other problems and new characteristics will be clarified by a description of the present specification and the accompanying drawings.

A semiconductor device according to an embodiment includes an optical waveguide formed on a substrate, an insulating film covering the optical waveguide, and a wiring part formed on the insulating film. A thin film part having a smaller thickness than the wiring part is provided above the optical waveguide. The thin film part is integrated with the wiring part.

According to the embodiment, the manufacturing cost of the semiconductor device can be reduced.

Figure 1:
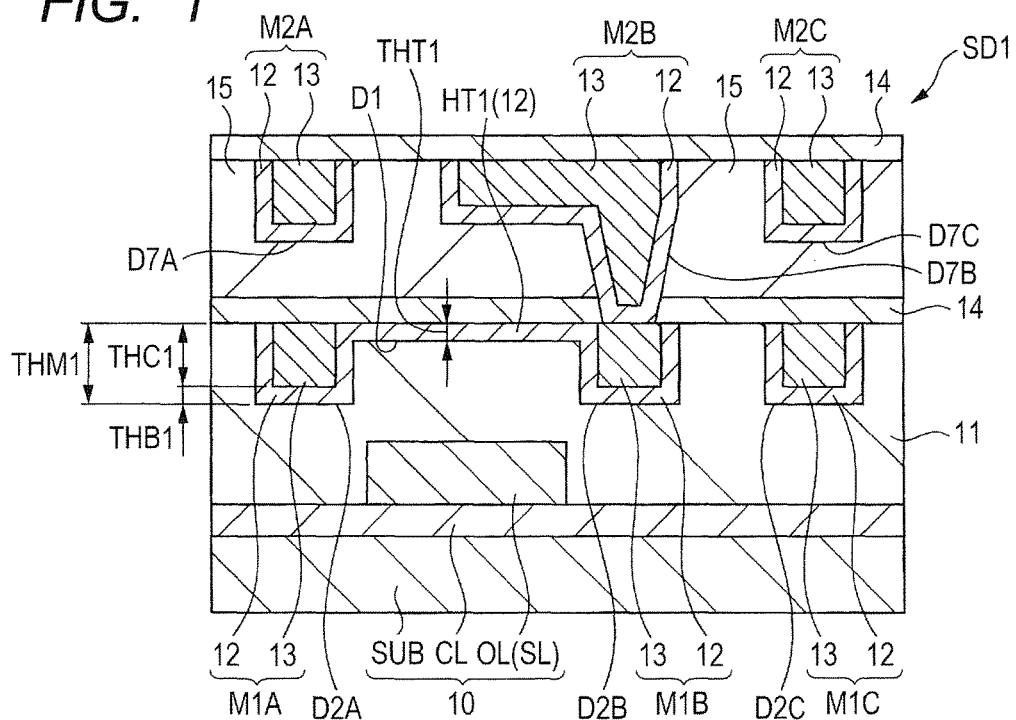
FIG. 1 is a cross-sectional view showing the principal part of a semiconductor device according to a first embodiment.

DETAILED DESCRIPTION (An Explanation of a Description Format, Basic Terms, and Use)

For the convenience of explanation, embodiments will be optionally described as, for example, a plurality of sections in the present application. These sections are relevant to one another unless the sections are specified as independent sections. These sections are the parts of an example, and one of the sections is a part of the detail of the other sections or a modification of at least a part of the other sections regardless of the description order of the sections. In principle, a repeated explanation of the same parts is omitted. Moreover, the constituent elements of the embodiments are unnecessary unless the constituent elements are specified as necessary constituent elements, the number of constituent elements is limited in theory, and the constituent elements are clearly necessary in the context.

Likewise, in the description of the embodiments, a material or composition described as "X including A" includes elements other than A unless the material or composition is specified as a material or composition only including A and the material or composition only includes A in the context. For example, a component means "X is mainly composed of A". For example, "silicon member" is not limited to a pure silicon member and may be made of a multicomponent alloy mainly composed of a silicon germanium (SiGe) alloy and other kinds of silicon and may be made of other additional matters. Furthermore, regarding gold plating, a Cu layer, and nickel plating, members mainly composed of gold, Cu, and nickel may be provided in addition to pure members unless only pure members are specified.

Moreover, regarding a specific numeric value or quantity, a numeric value larger than the specific numeric value or a numeric value smaller than the specific numeric value may be used unless the specific numeric value is specified, the numeric value is limited in theory, and the numeric value is clearly specified in the context.

In the drawings of the embodiments, the same or similar parts are indicated by the same or similar symbols or reference numbers and an explanation thereof is not repeated in principle.

In the accompanying drawings, if hatching may cause complexity or a gap is clearly distinguishable, hatching may be omitted even in a cross section. Accordingly, the edge of a hole closed on a plane may be omitted in the background if the hole is clarified in a description. Moreover, in the drawings other than a cross section, hatching may be added to specify a part other than a gap.

First Embodiment

<Semiconductor Device>

Figure 2:
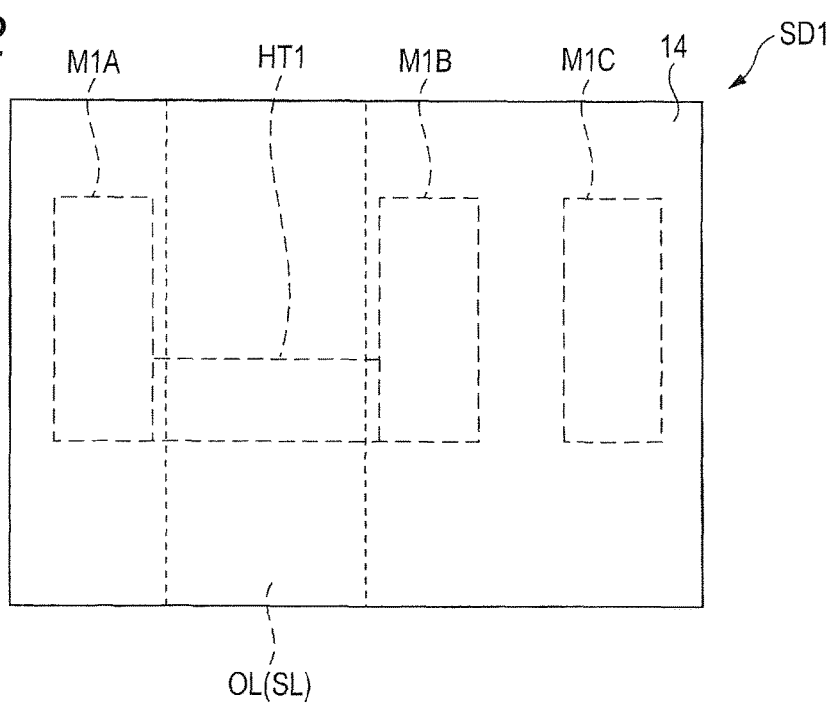
FIG. 2 is a plan view showing the semiconductor device according to the first embodiment.

Referring to FIGS. 1 and 2, the configuration of a semiconductor device according to an embodiment will be described below. FIG. 1 is a cross-sectional view showing the principal part of a semiconductor device SD1 according to the first embodiment. FIG. 2 is a plan view showing the semiconductor device SD1 according to the first embodiment. To enhance understanding of the planar structure of the semiconductor device SD1, FIG. 2 only shows an optical waveguide OL, a thin film part HT1, wiring parts M1A, M1B, and M1C, and a protective film 14.

In the following explanation, a transmission line for an optical signal and an optical modulator will be mainly discussed among from integrated optical devices on a silicon on insulator (SOI) substrate. A silicon electronic circuit, which is not shown, and the optical modulator are formed on different semiconductor chips. The semiconductor chips and a light source are mounted on, for example, an interposer substrate (circuit board) and include a semiconductor device. The semiconductor device SD1 of the first embodiment shown in FIGS. 1 and 2 indicates apart of an optical modulator PC shown in FIG. 3, which will be discussed later.

As shown in FIG. 1, the semiconductor device SD1 of the first embodiment includes a substrate SUB, an insulating layer (first insulating film) CL formed on the substrate SUB, and a semiconductor layer SL formed on the insulating layer CL. The substrate SUB, the insulating layer CL, and the semiconductor layer SL include a semiconductor substrate 10 serving as a SOI substrate. The substrate SUB includes, for example, a p-type silicon (Si) single-crystal substrate having a plane direction of (100) and a resistivity of about 5 to 50 Ωcm. The insulating layer CL is also called a buried oxide (BOX) layer and includes, for example, a silicon oxide ($SiO_2$) film. The semiconductor layer SL is also called an SOI layer and is a thin p-type silicon single-crystal substrate having a plane direction of (100) and a resistivity of about 5 to 50 Ωcm. The SOI substrate 10 can be formed by, for example, separation by implementation of oxygen (SIMOX), lamination, or a smart-cut method. The substrate SUB has a thickness of, for example, about 750 nm. The insulating layer CL has a thickness of, for example, about 2 to 3 μm. The semiconductor layer SL has a thickness of, for example, about 180 to 250 nm. To enhance understanding, the semiconductor layer SL is increased in thickness in the cross-sectional view.

On the insulating layer CL, the optical waveguide OL for transmitting the optical signal is formed by patterning a part of the semiconductor layer SL. The optical waveguide OL in FIG. 1 is a rectangular waveguide that is rectangular in cross section in a direction orthogonal to the traveling direction of the optical signal (a vertical direction in FIG. 1). The optical waveguide OL is not limited to the rectangular waveguide. For example, the optical waveguide OL may be a rib waveguide that is convex in cross section in the direction orthogonal to the traveling direction of the optical signal, providing the effect of containing lateral light. Moreover, the single optical waveguide OL on the insulating layer CL in FIG. 1 may be replaced with multiple optical waveguides.

In a region (not shown) of the semiconductor layer SL, multiple MOSFETs (semiconductor elements) constituting a silicon integrated circuit are formed. For example, the MOSFET is a fully depleted MOSFET in which a source and a drain are formed with a high impurity concentration on the semiconductor layer SL on each side of a depletion layer including the semiconductor layer SL and a gate electrode is formed on the depletion layer with a gate insulating film interposed between the gate electrode and the depletion layer.

An interlayer insulating film (second insulating film) 11 is formed on the optical waveguide OL. The sides and top surface of the optical waveguide OL are covered with the interlayer insulating film 11. The interlayer insulating film 11 is made/formed of silicon oxide. The interlayer insulating film 11 has a thickness of, for example, about 2 to 3 μm.

As shown in FIGS. 1 and 2, the thin film part HT1 shaped like a planar rectangle is formed above the optical waveguide OL such that the thin film part HT1 partially overlaps the optical waveguide OL in a planar configuration. Moreover, the pair of wiring parts M1A and M1B is formed on both ends of the thin film part HT1 in the longitudinal direction. The pair of wiring parts M1A and M1B and the thin film part HT1 are integrated with each other. Thus, the pair of wiring parts M1A and M1B and the thin film part HT1 are electrically coupled to each other.

As shown in FIG. 1, in the first embodiment, the thin film part HT1 has a thickness THT1 that is smaller than a thickness THM1 of the pair of wiring parts M1A and M1B. The thickness THT1 of the thin film part HT1 is preferably 10 nm to 200 nm. In other words, the thin film part HT1 has a larger resistance than the pair of wiring parts M1A and M1B. When the thin film part HT1 is energized through the wiring parts M1A and M1B, heat is generated by the thin film part HT1 that has a larger resistance than the pair of wiring parts M1A and M1B, and the heat is transferred to the optical waveguide OL through the interlayer insulating film 11. As described above, the thin film part HT1 is a heater that changes the temperature of the optical waveguide OL so as to change the phase of the optical signal transmitted through the optical waveguide OL.

On the interlayer insulating film 11, the wiring part M1C is formed along with the thin film part HT1 and the pair of wiring parts M1A and M1B. For example, the wiring part M1C is a wiring part for coupling MOSFETs that include a silicon integrated circuit formed in a region (not shown) of the semiconductor layer SL.

As shown in FIG. 1, the wiring parts M1A, M1B, and M1C respectively include a laminated film of a barrier film 12 and a conductive film 13. The conductive film 13 is made of, for example, copper. The barrier film 12 is a conductive film for preventing diffusion of copper contained in the conductive film 13. The barrier film 12 includes, for example, a laminated film of a tantalum nitride (TaN) film and a tantalum (Ta) film. Moreover, the thin film part HT1 of the first embodiment includes the barrier film 12. The barrier film 12 of the wiring parts M1A, M1B, and M1C and the barrier film 12 of the thin film part HT1 are integrated with each other. In other words, the barrier film 12 is a conductive film that includes parts of the wiring parts M1A, M1B, and M1C and also serves as a conductive film that includes the thin film part HT1.

As shown in FIG. 1, the thin film part HT1 is embedded in a wiring groove (first groove) D1 formed on the interlayer insulating film 11. The wiring parts M1A, M1B, and M1C are embedded in wiring grooves (second grooves) D2A, D2B, and D2C, respectively. The wiring grooves D2A, D2B, and D2C are formed on the interlayer insulating film 11. The wiring parts M1A, M1B, and M1C are damascene wires (damascene embedded wires) formed by a damascene process.

Furthermore, as shown in FIG. 1, the wiring parts M1A, M1B, and M1C and the thin film part HT1 are covered with the protective film 14. The protective film 14 is an insulating film for preventing the diffusion of copper contained in the conductive film 13. The protective film 14 includes, for example, a silicon oxynitride (SiON) film, a phosphorous silicate glass (PSG) film, or a silicon nitride ($Si_3N_4$) film that is deposited by chemical vapor deposition (CVD).

Furthermore, as shown in FIG. 1, an interlayer insulating film 15 is formed on the protective film 14 that covers the wiring parts M1A, M1B, and M1C and the thin film part HT1. The interlayer insulating film 15 is made of a so-called low-k material having a lower relative permittivity than silicon oxide. For example, the interlayer insulating film 15 is made of hydrogenated silicon oxycarbide (SiCOH).

Moreover, wiring parts M2A, M2B, and M2C are formed on the protective film 14 that covers the wiring parts M1A, M1B, and M1C and the thin film part HT1. The wiring parts M2A, M2B, and M2C are, for example, wiring parts for electrically coupling elements formed in a region (not shown). The wiring parts M2A, M2B, and M2C are embedded in wiring grooves D7A, D7B, and D7C, respectively.

The wiring grooves D7A, D7B, and D7C are formed on the interlayer insulating film 15. The wiring parts M2A, M2B, and M2C are damascene wires (damascene embedded wires) formed by the damascene process. The wiring part M2B, in particular, is a dual damascene wire formed by a dual damascene process. In the dual damascene process, for example, a via hole penetrating an interlayer insulating film is formed, a wiring groove having a smaller depth than the via hole is formed on the top surface of the interlayer insulating film, and then a metal is embedded in the via hole and the wiring groove, so that a via in the via hole and a wire in the wiring groove on the via hole are formed at the same time. As shown in FIG. 1, the wiring part M2B is coupled to the wiring part M1B.

Furthermore, as shown in FIG. 1, the wiring parts M2A, M2B, and M2C are covered with the protective film 14. Another wiring part, which is not specifically shown, may be formed on the protective film 14 formed on the wiring parts M2A, M2B, and M2C. Alternatively, pad electrodes or a passivation film may be formed on the protective film 14.

<Optical Modulator>

Figure 3:
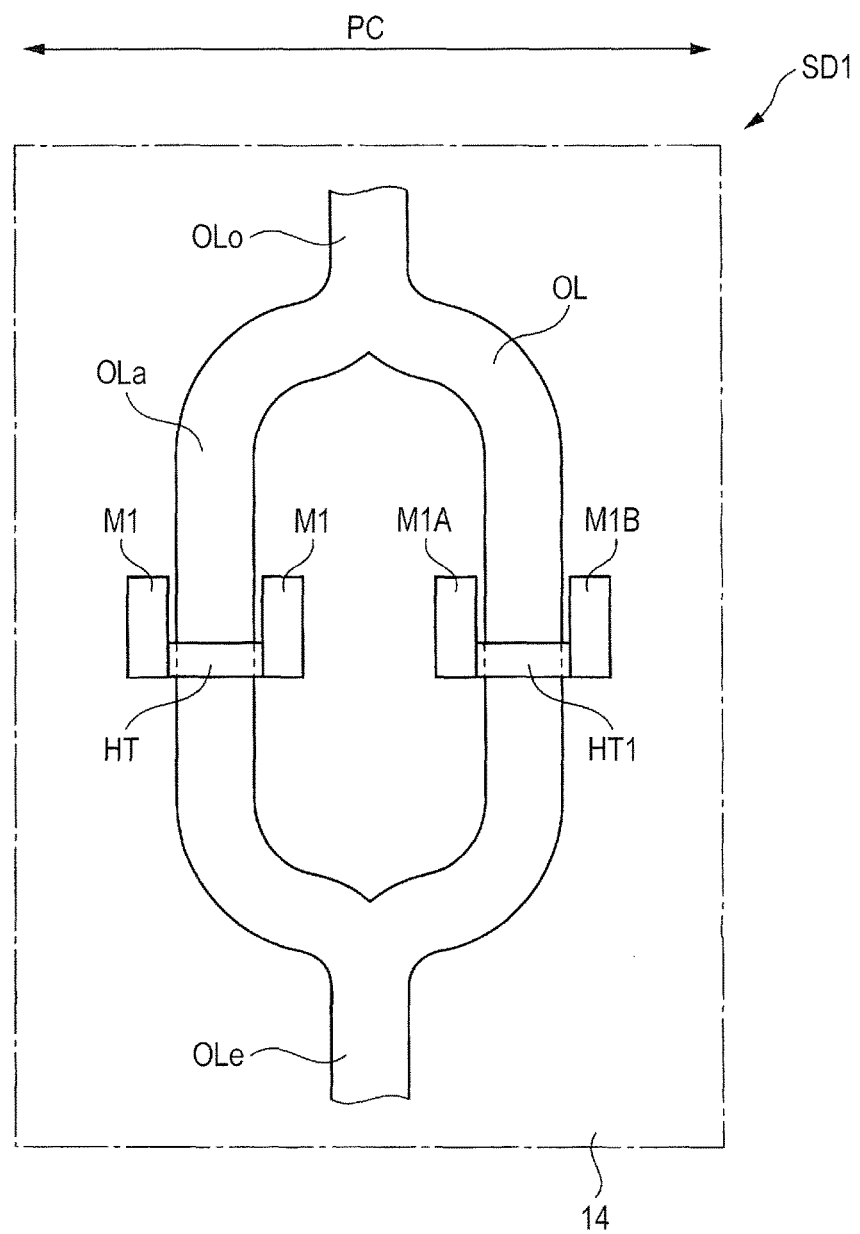
FIG. 3 is a plan view showing an optical modulator in the semiconductor device of the first embodiment.

Referring to FIG. 3, the optical modulator PC constituting the semiconductor device SD1 of the first embodiment will be described below. FIG. 3 is a plan view showing the optical modulator PC of the first embodiment.

The configuration of the optical modulator PC according to the first embodiment will be first described below. As shown in FIG. 3, the optical modulator PC constituting the semiconductor device SD1 of the first embodiment includes optical waveguides OLo, OL, OLa, and OLe, the thin film part HT1 formed above the optical waveguide OL, the wiring parts M1A and M1B that supply power to the thin film part HT1, a heater HT formed above the optical waveguide OLa, and wiring parts M1 that supply power to the heater HT. The optical waveguides OL and OLa are two optical waveguides split from the optical waveguide OLo. The optical waveguide OLe is a joint optical waveguide between the optical waveguides OL and OLa.

The operations of the optical modulator PC according to the first embodiment will be described below. Light inputted to the optical modulator PC from a light source (not shown) through the optical waveguide OLo is split to the two optical waveguides OL and OLa after passing through the optical waveguide OLo.

In this case, when the heater HT is energized through the wiring parts M1, heat is generated by the heater HT. When the thin film part HT1 is energized through the wiring parts M1A and M1B as described above, heat is generated by the thin film part HT1. The heat generated by the thin film part HT1 and the heater HT is transferred to the optical waveguides OL and OLa. When the optical waveguides OL and OLa are heated, the index of refraction of silicon constituting the optical waveguides OL and OLa changes in the heated regions of the optical waveguides OL and OLa. This changes an effective index of refraction changes relative to light passing through the heated regions of the optical waveguides OL and OLa.

Thus, the phase of light passing through the optical waveguides OL and OLa changes through the heated regions of the optical waveguides OL and OLa. After that, light having passed the optical waveguides OL and OLa joins again at the optical waveguide OLe. At this point, the light having passed through the optical waveguides OL and OLa interfere with each other. At this point, the quantity of heat generated from the thin film part HT1 and the quantity of heat generated from the heater HT are changed so as to vary a change of the index of refraction of the optical waveguide OL and a change of the index of refraction of the optical waveguide OLa. Hence, in the optical modulator PC, the intensity and phase of light outputted from the optical waveguide OLe can be changed by the thin film part HT1 and the heater HT from the intensity and phase of light inputted to the optical waveguide OLo.

<Method of Manufacturing the Semiconductor Device>

Referring to FIGS. 4 to 15, a method of manufacturing the semiconductor device SD1 according to the first embodiment will be described below in the order of steps. FIGS. 4, 6, 8, 9, 11, 13, and 14 are cross-sectional views showing the principal part of the semiconductor device SD1 in the manufacturing process according to the first embodiment. FIGS. 5, 7, 10, 12, and 15 are plan views showing the manufacturing process of the semiconductor device SD1 according to the first embodiment.

First, the SOI substrate 10 including the substrate SUB, the insulating layer CL, and the semiconductor layer SL is prepared, which is not shown. The SOI substrate 10 is a SOI wafer substantially circular in plan view. Subsequently, the semiconductor layer SL is patterned by dry etching with a photoresist film formed as a mask on the semiconductor layer SL, thereby forming the optical waveguide OL including the semiconductor layer SL in a part of the SOI substrate 10. The optical waveguide OL is then doped with a p-type impurity of about $1 \times 10^{15}$ cm$^{-3}$ by ion implantation with a photoresist film serving as a mask. After the photoresist film is removed, the SOI substrate 10 is annealed to activate the p-type impurity. Moreover, in another region of the semiconductor layer SL, multiple MOSFETs constituting the silicon integrated circuit are formed (not shown).

Figure 4:
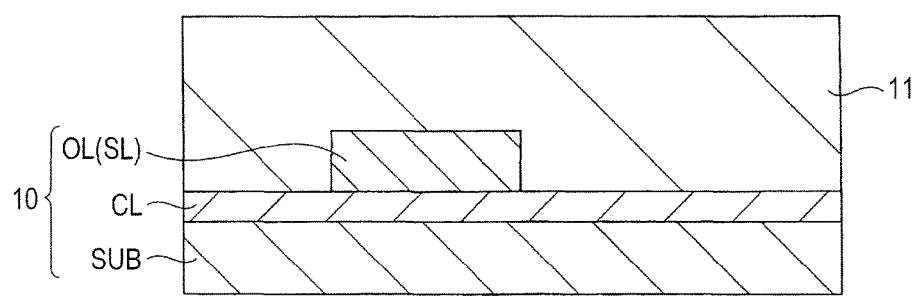
FIG. 4 is a cross-sectional view showing the principal part of the semiconductor device in the manufacturing process according to the first embodiment.
Figure 5:
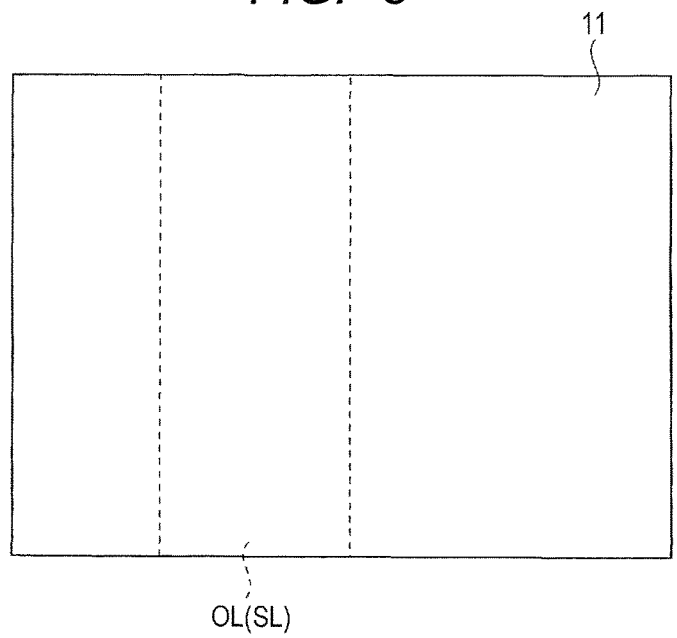
FIG. 5 is a plan view showing the manufacturing process of the semiconductor device according to the first embodiment.

Subsequently, as shown in FIGS. 4 and 5, the interlayer insulating film 11 is deposited on the insulating layer CL such that the interlayer insulating film 11 covers the optical waveguide OL.

Figure 6:
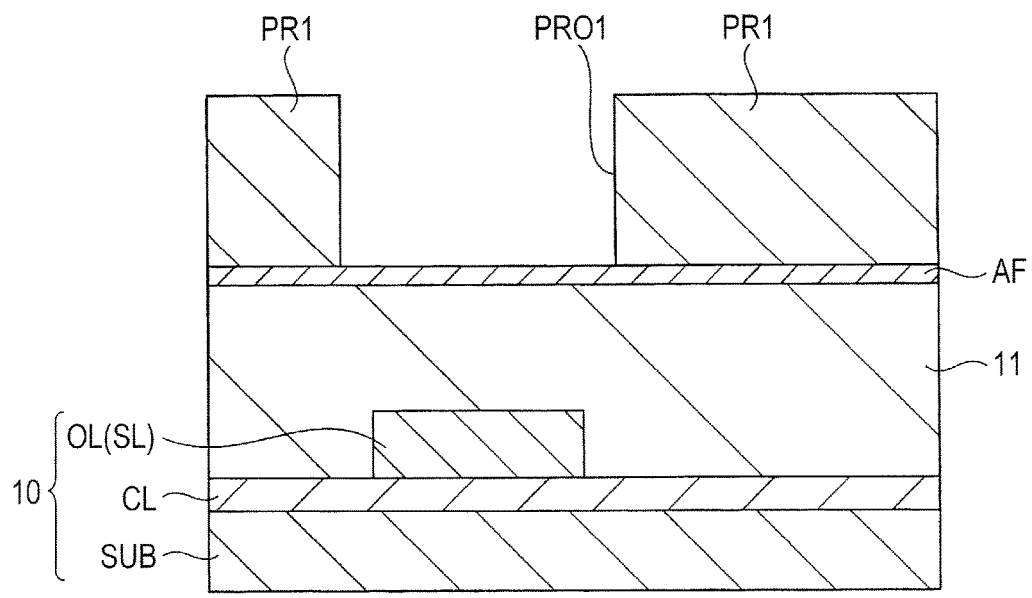
FIG. 6 is a cross-sectional view showing the principal part of the semiconductor device in the manufacturing process, subsequently to FIGS. 4 and 5, according to the first embodiment.
Figure 7:
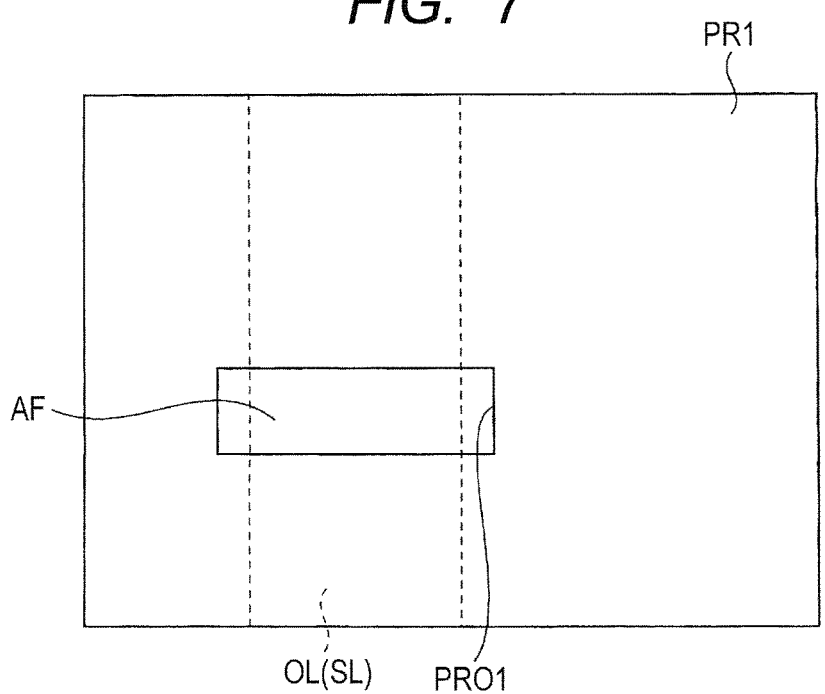
FIG. 7 is a plan view showing the manufacturing process of the semiconductor device, subsequently to FIGS. 4 and 5, according to the first embodiment.
Figure 8:
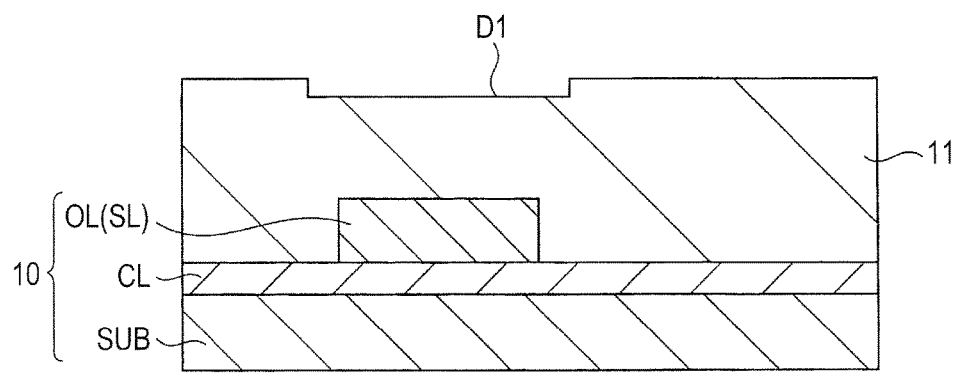
FIG. 8 is a cross-sectional view showing the principal part of the semiconductor device in the manufacturing process, subsequently to FIGS. 6 and 7, according to the first embodiment.

Thereafter, as shown in FIGS. 6 and 7, the interlayer insulating film 11 is coated with an anti-reflection coating AF, and then a photoresist film PR1 is formed on the anti-reflection coating AF. The interlayer insulating film 11 is dry-etched through an opening part PRO1 of the photoresist film PR1 with the photoresist film PR1 serving as a mask, so that the interlayer insulating film 11 is patterned. After that, the photoresist film PR1 is removed by etching with an organic solvent or oxygen asking. Thus, as shown in FIG. 8, the wiring groove D1 is formed on the interlayer insulating film 11 and above the optical waveguide OL such that the wiring groove D1 overlaps the optical waveguide OL in a planar configuration.

Figure 9:
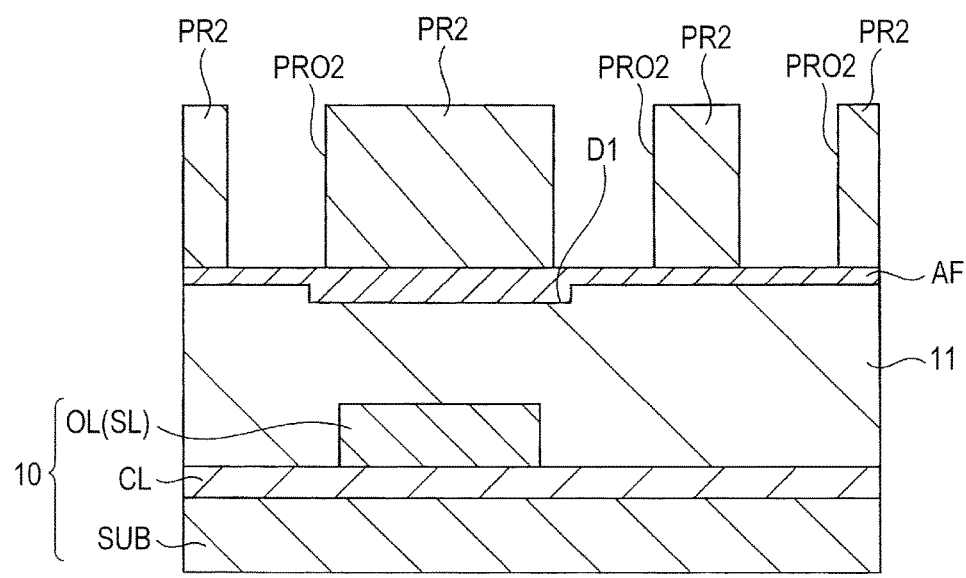
FIG. 9 is a cross-sectional view showing the principal part of the semiconductor device in the manufacturing process, subsequently to FIG. 8, according to the first embodiment.
Figure 10:
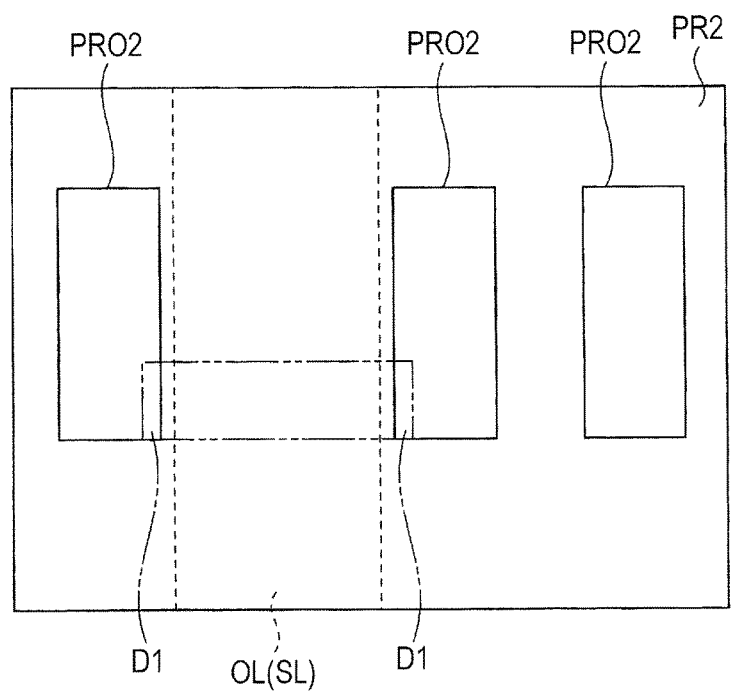
FIG. 10 is a plan view showing the manufacturing process of the semiconductor device, subsequently to FIG. 8, according to the first embodiment.

Subsequently, as shown in FIGS. 9 and 10, the interlayer insulating film 11 having the wiring groove D1 is coated with the anti-reflection coating AF and the top surface of the interlayer insulating film 11 is flattened by the anti-reflection coating AF. A dot-dot-dash line in FIG. 10 indicates the wiring groove D1 under the anti-reflection coating AF. After that, a photoresist film PR2 is formed on the anti-reflection coating AF. The interlayer insulating film 11 is dry-etched through opening parts PRO2 of the photoresist film PR2 with the photoresist film PR2 serving as a mask, so that the interlayer insulating film 11 is patterned. Thereafter, the photoresist film PR2 is removed by etching with an organic solvent or oxygen asking. Thus, as shown in FIGS. 11 and 12, the wiring grooves D2A, D2B, and D2C are formed on the interlayer insulating film 11.

Figure 11:
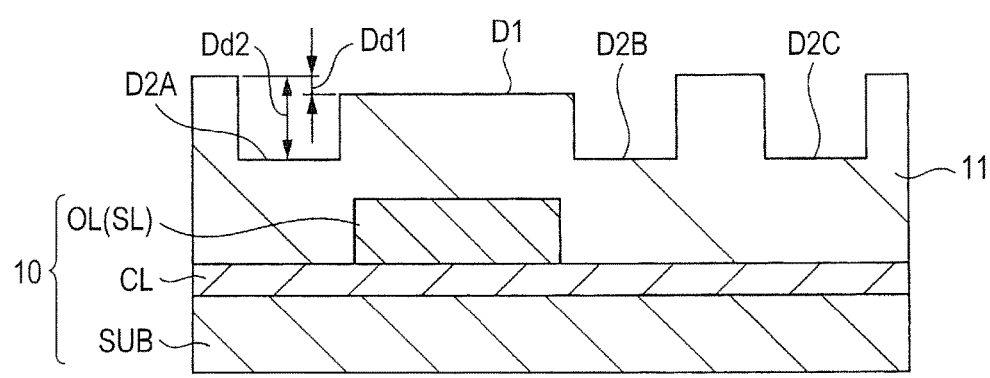
FIG. 11 is a cross-sectional view showing the principal part of the semiconductor device in the manufacturing process, subsequently to FIGS. 9 and 10, according to the first embodiment.
Figure 12:
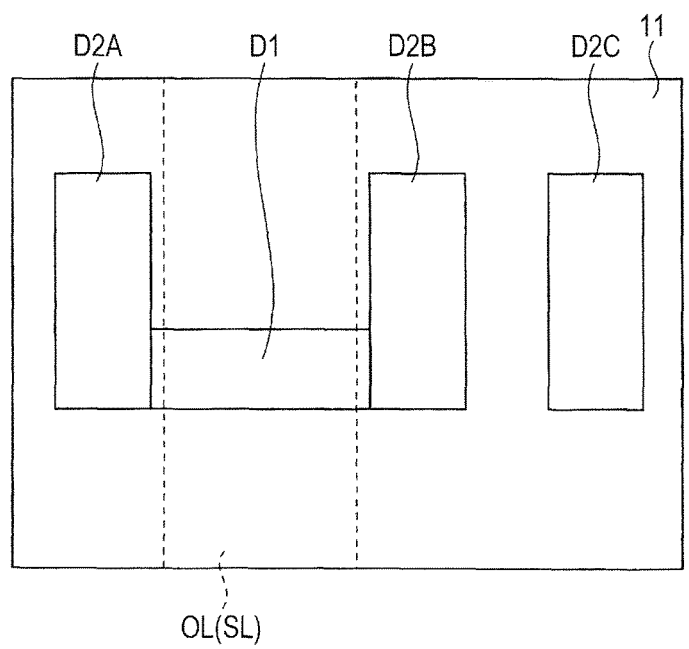
FIG. 12 is a plan view showing the manufacturing process of the semiconductor device, subsequently to FIGS. 9 and 10, according to the first embodiment.

At this point, as shown in FIG. 11, the wiring grooves D2A, D2B, and D2C have the same depth Dd2 relative to the top surface of the interlayer insulating film 11 before patterning (Hereinafter, a depth is indicated relative to the top surface of the interlayer insulating film 11 before patterning, unless otherwise specified). The depth Dd2 of the wiring grooves D2A, D2B, and D2C is larger than a depth Dd1 of the wiring groove D1.

As shown in FIGS. 9 and 10, the opening parts PRO2 of the photoresist film PR2 partially overlap both ends of the wiring groove D1 in the longitudinal direction. Thus, as shown in FIGS. 11 and 12, both ends of the wiring groove D1 in the longitudinal direction continue to the wiring grooves D2A and D2B. In other words, one end of the wiring groove D1 in the longitudinal direction is coupled to the wiring groove D2A, whereas the other end of the wiring groove D1 is coupled to the wiring groove D2B.

Figure 13:
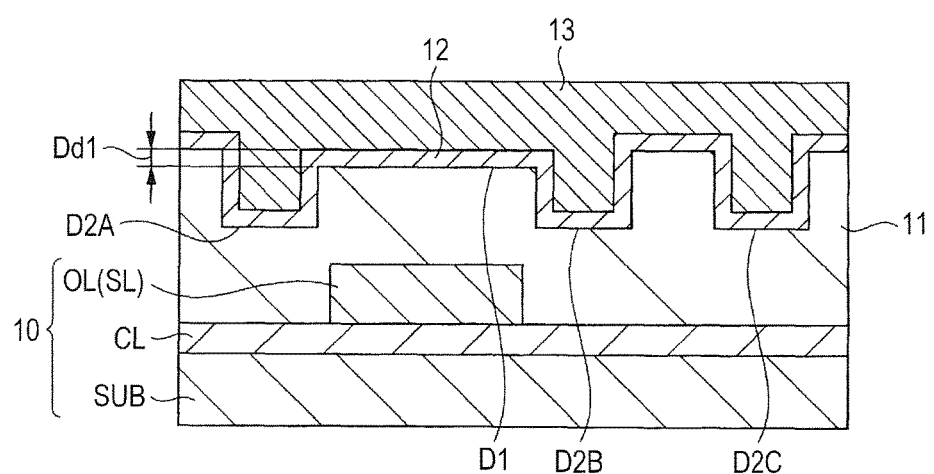
FIG. 13 is a cross-sectional view showing the principal part of the semiconductor device in the manufacturing process, subsequently to FIGS. 11 and 12, according to the first embodiment.

Subsequently, as shown in FIG. 13, the barrier film 12 is formed on the interlayer insulating film 11 by sputtering. Furthermore, a seed film (not shown) made of copper is formed on the barrier film 12 by sputtering. Thereafter, the conductive film 13 is formed on the seed film (not shown) by electrolytic plating. In this configuration, as shown in FIG. 13, the barrier film 12 has the same thickness as the depth Dd1 of the wiring groove D1.

Figure 14:
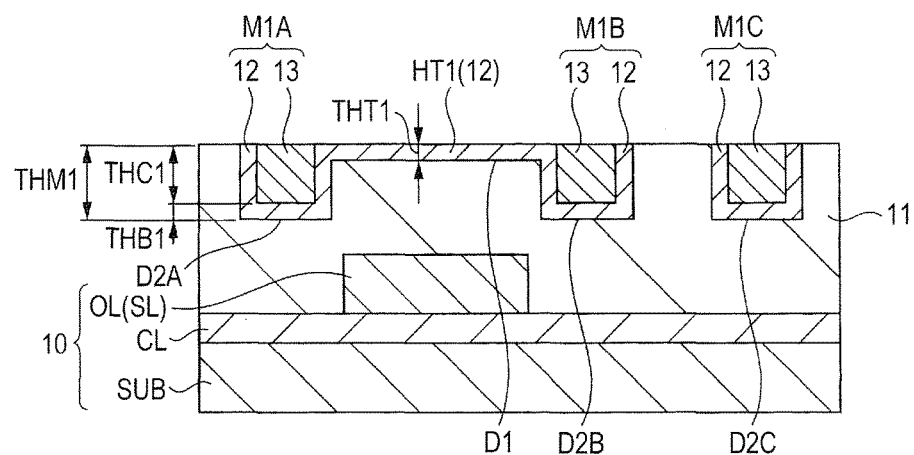
FIG. 14 is a cross-sectional view showing the principal part of the semiconductor device in the manufacturing process, subsequently to FIG. 13, according to the first embodiment.
Figure 15:
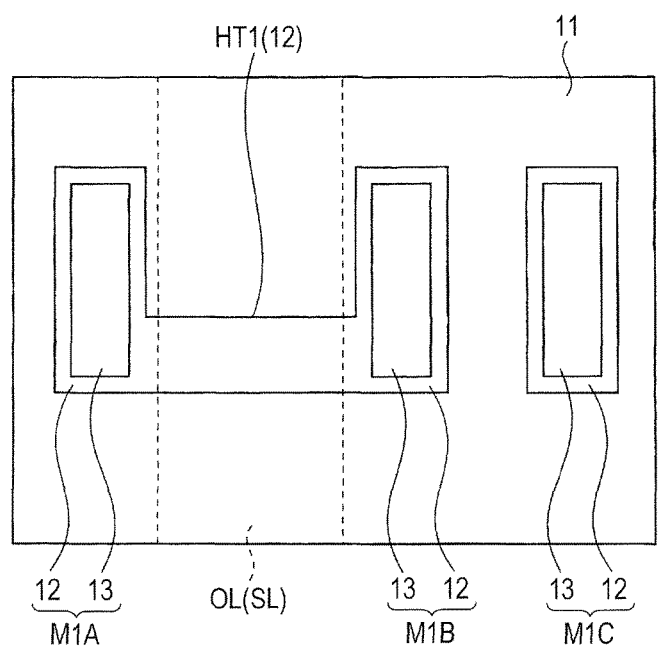
FIG. 15 is a plan view showing the manufacturing process of the semiconductor device, subsequently to FIG. 13, according to the first embodiment.

Thereafter, as shown in FIGS. 14 and 15, the barrier film 12 and the conductive film 13 are removed outside the wiring grooves D1, D2A, D2B, and D2C by chemical mechanical polishing (CMP method). As described above, the barrier film 12 has the same thickness as the depth Dd1 of the wiring groove D1 and thus after the removal of the barrier film 12 and the conductive film 13 outside the wiring groove D1, only the barrier film 12 is left in the wiring groove D1. Moreover, the depth Dd2 of the wiring grooves D2A, D2B, and D2C is larger than the depth Dd1 of the wiring groove D1 and thus after the removal of the barrier film 12 and the conductive film 13 outside the wiring grooves D2A, D2B, and D2C, both of the barrier film 12 and the conductive film 13 are left in each of the wiring grooves D2A, D2B, and D2C. Hence, the wiring parts M1A, M1B, and M1C, each of which includes the barrier film 12 and the conductive film 13, are formed in the wiring grooves D2A, D2B, and D2C, respectively. In the wiring groove D1, the thin film part HT1 is formed concurrently with the wiring parts M1A, M1B, and M1C. The thin film part HT1 includes the barrier film 12 and has a smaller thickness than the wiring parts M1A, M1B, and M1C.

As shown in FIG. 11, both ends of the wiring groove D1 in the longitudinal direction continue to the wiring grooves D2A and D2B. Thus, as shown in FIGS. 14 and 15, the barrier film 12 is left so as to be integrated with the interiors of the wiring groove D1 and the wiring grooves D2A and D2B. Hence, as shown in FIGS. 14 and 15, the barrier film 12 of the thin film part HT1 and the barrier film 12 of the wiring parts M1A and M1B are integrated with each other.

As shown in FIGS. 1 and 14, a thickness THB1 of the barrier film 12 constituting the wiring parts M1A, M1B, and M1C is equal to the thickness THT1 of the thin film part HT1. In this case, the barrier film 12 having a large thickness is preferably provided in order to reliably prevent the diffusion of copper contained in the conductive film 13. However, as shown in FIG. 1, if the barrier film 12 of the thin film part HT1 has an extremely large thickness, the resistance of the thin film part HT1 decreases so as to preventing the thin film part HT1 from acting as a heater. Hence, it is preferable that the thickness of the barrier film 12 constituting the thin film part HT1 is not too large. For this reason, the thickness THB1 of the barrier film 12, that is, the thickness THT1 of the thin film part HT1 is preferably 50 μm to 100 μm.

In reality, as shown in FIGS. 13 and 14, when the conductive film 13 of the wiring groove D1 is removed by CMP method, the barrier film 12 of the wiring groove D1 is also polished, so that the barrier film 12 constituting the thin film part HT1 is smaller in thickness than in the formation of the barrier film 12. Thus, the thickness of the barrier film 12 during the formation is set larger than that of the thickness of the barrier film 12 constituting the thin film part HT1a. This increases the thickness of the barrier film 12 constituting the wiring parts M1A, M1B, and M1C and reduces the thickness of the barrier film 12 constituting the thin film part HT1, thereby satisfying the requirement.

As shown in FIG. 14, the thin film part HT1 has a smaller thickness than the wiring parts M1A, M1B, and M1C. The thickness THT1 of the thin film part HT1 is equal to the depth Dd1 of the wiring groove D1 shown in FIG. 11. Moreover, the thickness THM1 of the wiring parts M1A, M1B, and M1C is the sum of the thickness THB1 of the barrier film 12 constituting the wiring parts M1A, M1B, and M1C and a thickness THC1 of the conductive film 13 constituting the wiring parts M1A, M1B, and M1C. The thickness THM1 is equal to the depth Dd2 of the wiring grooves D2A, D2B, and D2C shown in FIG. 11. Furthermore, the thickness THB1 of the barrier film 12 constituting the wiring parts M1A, M1B, and M1C is equal to the thickness THT1 of the thin film part HT1. Thus, as shown in FIG. 14, the thickness THT1 of the thin film part HT1 is smaller than the thickness THM1 of the wiring parts M1A, M1B, and M1C by the thickness THC1 of the conductive film 13 constituting the wiring parts M1A, M1B, and M1C.

Thereafter, as shown in FIG. 1, the protective film 14 made of silicon carbonitride (SiCN) or silicon nitride ($Si_3N_4$) is formed on the interlayer insulating film 11 by CVD. The wiring parts M1A, M1B, and M1C and the thin film part HT1 are covered with the protective film 14. Subsequently, the interlayer insulating film 15 made of hydrogenated silicon oxycarbide (SiCOH) is formed by CVD on the protective film 14 that covers the wiring parts MIA, M1B, and M1C and the thin film part HT1. After that, the photoresist film (not shown) is formed on the interlayer insulating film 15 and then the interlayer insulating film 15 and the protective film 14 are dry-etched, so that patterning is performed on the interlayer insulating film 15 and the protective film 14. Thus, as shown in FIG. 1, the wiring grooves D7A, D7B, and D7C are formed on the interlayer insulating film 15 and the protective film 14. The wiring groove D7B penetrates the interlayer insulating film 15 and the protective film 14 and is opened on the wiring part M1B.

Subsequently, the barrier film 12 is formed on the interlayer insulating film 15 by sputtering. Furthermore, a seed film (not shown) made of copper is formed on the barrier film 12 by sputtering. After that, the conductive film 13 is formed on the seed film (not shown) by electrolytic plating.

The barrier film 12 and the conductive film 13 are then removed outside the wiring grooves D7A, D7B, and D7C by CMP method. This forms the wiring parts M2A, M2B, and M2C including the barrier film 12 and the conductive film 13 left in the wiring grooves D7A, D7B, and D7C.

Thereafter, as shown in FIG. 1, the protective film 14 made of silicon carbonitride (SiCN) or silicon nitride ($Si_3N_4$) is formed on the interlayer insulating film 15 by CVD. The wiring parts M2A, M2B, and M2C are covered with the protective film 14. The SOI substrate (SOI wafer) 10 is then diced into chips, thereby completing the semiconductor device SD1 of the first embodiment shown in FIG. 1.

The method may include, as described above, the step of forming another wiring part, which is not particularly shown, on the protective film 14 formed on the wiring parts M2A, M2B, and M2C or the step of forming pad electrodes or a passivation film on the protective film 14.

<Explanation of Study Example>

Figure 16:
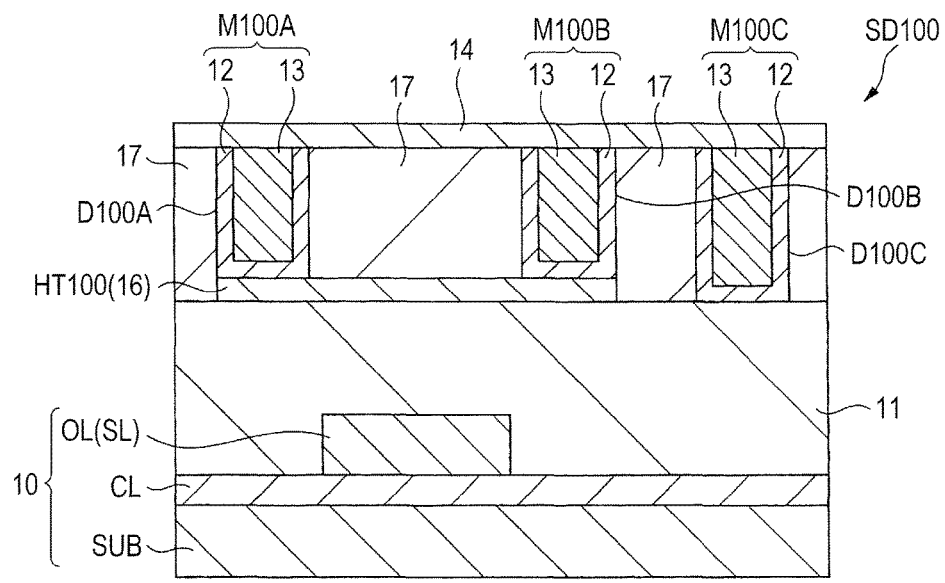
FIG. 16 is a cross-sectional view showing the principal part of a semiconductor device according to a study example.

Referring to FIGS. 16 to 21, the configuration of a semiconductor device and a method of manufacturing the same will be described below according to a study example of the inventors of the present application. FIG. 16 is a cross-sectional view showing the principal part of a semiconductor device SD100 according to the study example. FIGS. 17 to 21 are cross-sectional views showing the principal part of the semiconductor device SD100 in the manufacturing process according to the study example.

As shown in FIG. 16, from a substrate SUB to an interlayer insulating film 11, the configuration of the semiconductor device SD100 of the study example is identical in the thickness direction to the semiconductor device SD1 of the first embodiment shown in FIG. 1. In other words, the semiconductor device SD100 of the study example includes the substrate SUB, a insulating layer CL formed on the substrate SUB, and a semiconductor layer SL formed on the insulating layer CL. The substrate SUB, the insulating layer CL, and the semiconductor layer SL include a semiconductor substrate 10 serving as a SOI substrate. On the insulating layer CL, an optical waveguide OL for transmitting an optical signal is formed by patterning a part of the semiconductor layer SL. The interlayer insulating film 11 is formed on the optical waveguide OL. Moreover, an interlayer insulating film 17 is formed on the interlayer insulating film 11.

As shown in FIG. 16, a heater HT 100 is formed above the optical waveguide OL. Furthermore, a pair of wiring parts M100A and M100B is embedded in the interlayer insulating film 17. The wiring parts M100A and M100B are electrically coupled to the heater HT 100. When the heater HT 100 is energized, heat is generated by the heater HT 100 and then the heat is transferred to the optical waveguide OL through the interlayer insulating film 11. In this way, like the thin film part HT1 of the first embodiment, the heater HT 100 is a heater that changes the temperature of the optical waveguide OL so as to change the phase of the optical signal transmitted through the optical waveguide OL. In the interlayer insulating film 17, a wiring part M100C is embedded along with the heater HT 100 and the pair of wiring parts M100A and M100B.

As shown in FIG. 16, the wiring parts M100A, M100B, and M100C respectively include a laminated film of a barrier film 12 and a conductive film 13. The heater HT 100 of the study example includes a titanium nitride film 16. The wiring parts M100A, M100B, and M100C are embedded in wiring grooves D100A, D100B, and D100C, respectively. The wiring grooves D100A, D100B, and D100C are formed on the interlayer insulating film 17. As shown in FIG. 16, the wiring parts M100A, M100B, and M100C are covered with a protective film 14.

With this configuration, as shown in FIG. 16, the semiconductor device SD100 includes the heater HT 100 in the insulating film 17 above the optical waveguide OL formed in a part of the SOI substrate 10. In the semiconductor device SD100, the heater HT 100 and the pair of wiring parts M100A and M100B coupled to the heater HT 100 are separately formed.

Referring to FIGS. 17 to 21, the method of manufacturing the semiconductor device SD100 according to the study example will be described below in the order of steps.

As described above, from the substrate SUB to the interlayer insulating film 11, the configuration of the semiconductor device SD100 of the study example in FIG. 16 is identical to the semiconductor device SD1 of the first embodiment. Hence, from the preparation of the SOI substrate 10 to the deposition of the interlayer insulating film 11, the method of manufacturing the semiconductor device SD100 according to the study example is identical to the method of manufacturing the semiconductor device SD1 according to the first embodiment.

Figure 17:
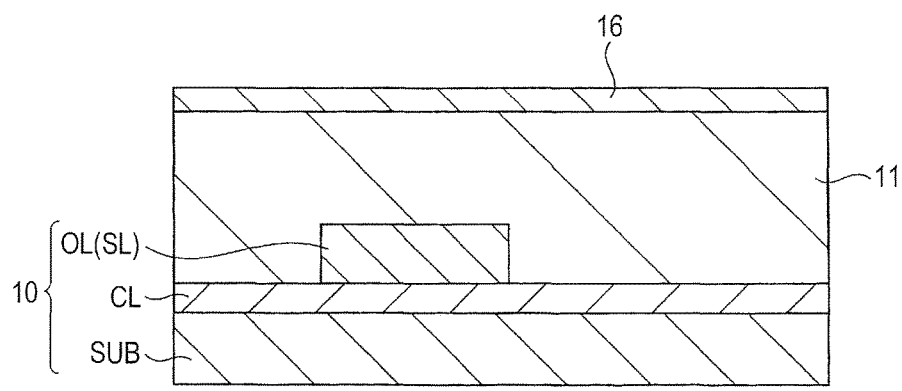
FIG. 17 is a cross-sectional view showing the principal part of the semiconductor device in the manufacturing process according to the study example.

Thereafter, as shown in FIG. 17, the titanium nitride film 16 is formed on the interlayer insulating film 11 by sputtering. A photoresist film (not shown) is formed on the titanium nitride film 16, and then the titanium nitride film 16 is patterned by dry etching with the photoresist film serving as a mask. The photoresist film is then removed by etching with an organic solvent or oxygen ashing. This forms the heater HT 100.

Figure 18:
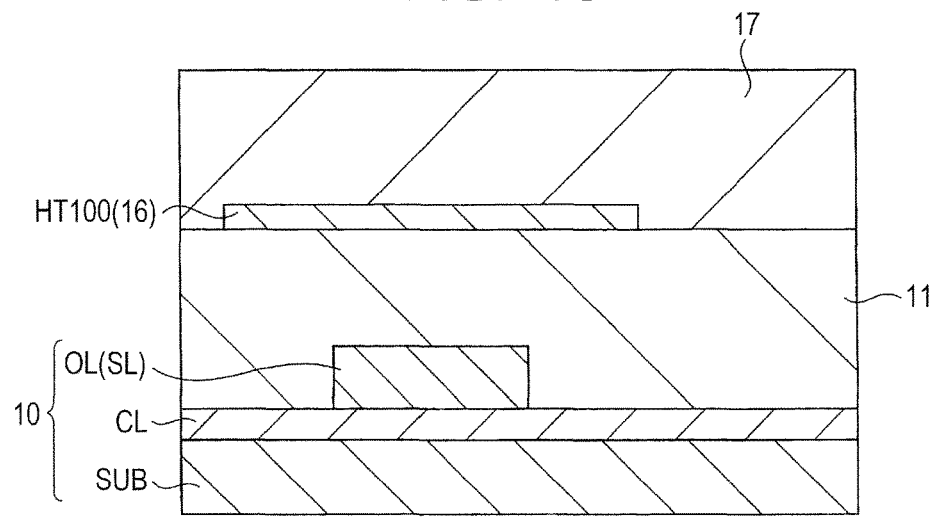
FIG. 18 is a cross-sectional view showing the principal part of the semiconductor device in the manufacturing process, subsequently to FIG. 17, according to the study example.

Subsequently, as shown in FIG. 18, the interlayer insulating film 17 is deposited by CVD so as to cover the heater HT 100. The interlayer insulating film 17 is made of, for example, silicon oxide. The top surface of the interlayer insulating film 17 is then flattened by CMP method.

Figure 19:
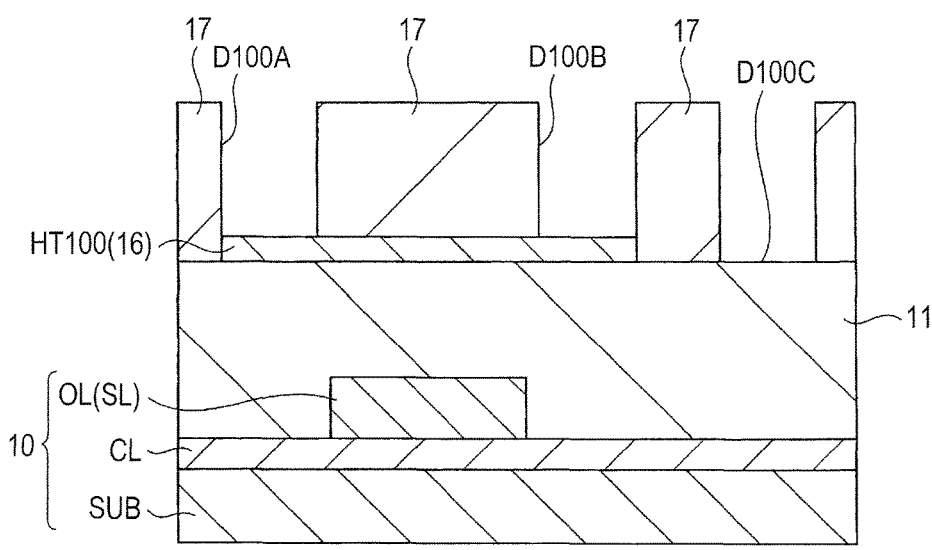
FIG. 19 is a cross-sectional view showing the principal part of the semiconductor device in the manufacturing process, subsequently to FIG. 18, according to the study example.

Subsequently, the interlayer insulating film 17 is coated with an anti-reflection coating, which is not shown, and then a photoresist film is formed on the anti-reflection coating. The interlayer insulating film 17 is dry-etched with the photoresist film serving as a mask, so that the interlayer insulating film 17 is patterned. After that, the photoresist film is removed by etching with an organic solvent or oxygen ashing. Thus, as shown in FIG. 19, the wiring grooves D100A, D100B, and D100C are formed on the interlayer insulating film 17.

Figure 20:
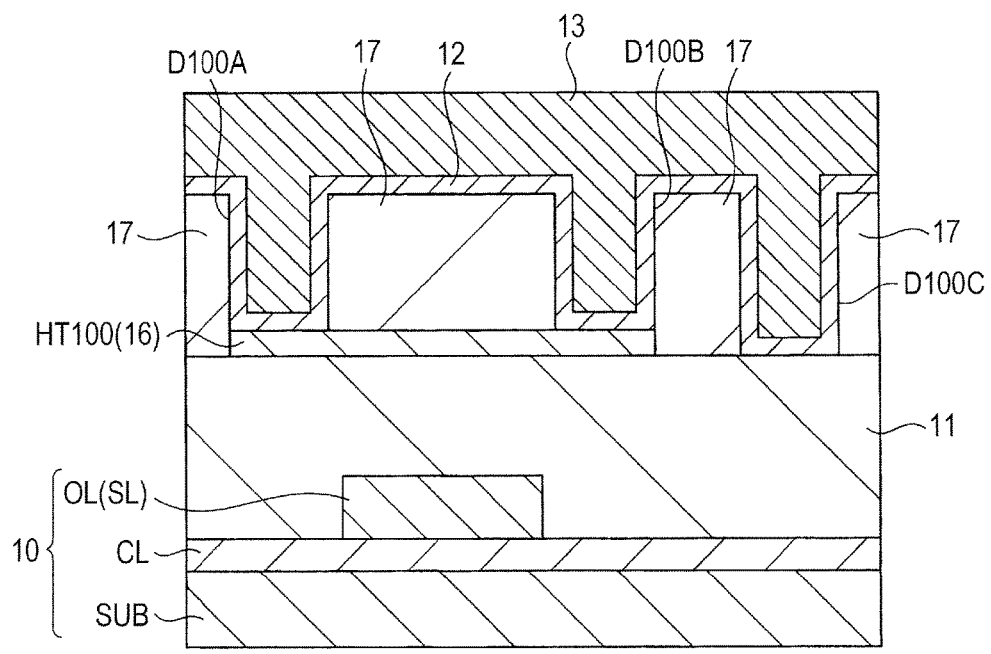
FIG. 20 is a cross-sectional view showing the principal part of the semiconductor device in the manufacturing process, subsequently to FIG. 19, according to the study example.

Subsequently, as shown in FIG. 20, the barrier film 12 is formed on the interlayer insulating film 17 and the heater HT 100 by sputtering. Furthermore, a seed film (not shown) made of copper is formed on the barrier film 12 by sputtering. After that, the conductive film 13 is formed on the seed film (not shown) by electrolytic plating.

Figure 21:
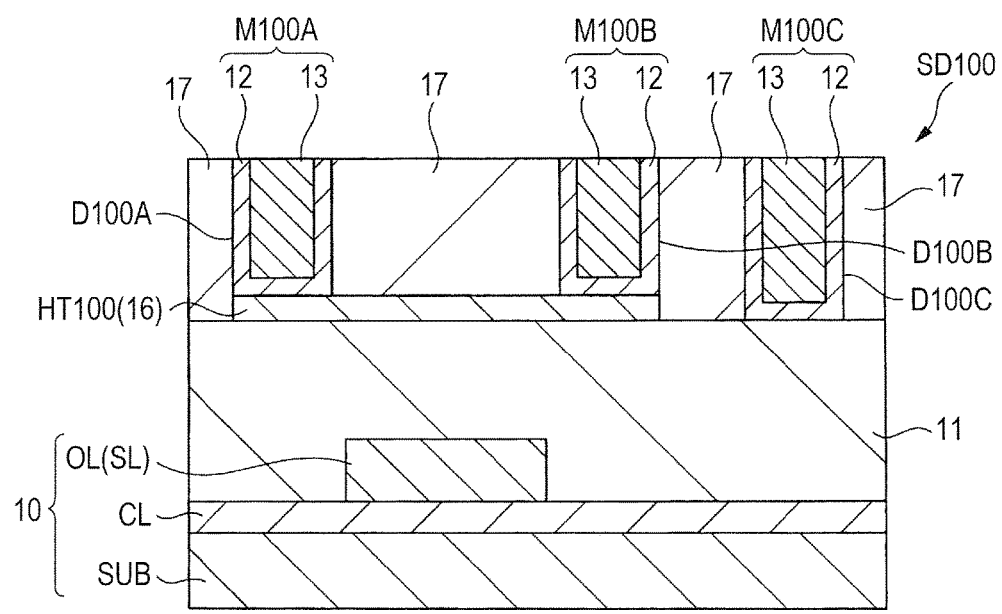
FIG. 21 is a cross-sectional view showing the principal part of the semiconductor device in the manufacturing process, subsequently to FIG. 20, according to the study example.

Subsequently, as shown in FIG. 21, the barrier film 12 and the conductive film 13 are removed outside the wiring grooves D100A, D100B, and D100C by CMP method. This forms the wiring parts M100A, M100B, and M100C including the barrier film 12 and the conductive film 13 that are left in the wiring grooves D100A, D100B, and D100C. The wiring parts M100A and M100B, in particular, are wires for supplying power to the heater HT 100 and are electrically coupled to the heater HT 100.

After that, as shown in FIG. 16, the protective film 14 made of silicon carbonitride (SiCN) or silicon nitride ($Si_3N_4$) is formed on the interlayer insulating film 17 by CVD. The wiring parts M100A, M100B, and M100C are covered with the protective film 14. The SOI substrate (SOI wafer) 10 is then diced into chips, thereby completing the semiconductor device SD100 of the study example shown in FIG. 16.

In summary, in order to form the heater HT 100 in the insulating film 17 above the optical waveguide OL formed in a part of the SOI substrate 10, the following steps are necessary; depositing the titanium nitride film 16 on the interlayer insulating film 11 covering the optical waveguide OL (step 101), forming the heater HT 100 by patterning the titanium nitride film 16 (step 102), depositing the interlayer insulating film 17 on the heater HT 100 (step 103), flattening the interlayer insulating film 17 (step 104), forming the wiring grooves D100A and D100B up to the heater HT 100 by etching the interlayer insulating film 17 (step 105), forming the barrier film 12 and the conductive film 13 on the interlayer insulating film 17 and the heater HT 100 (step 106), and forming the wiring parts M100A and M100B by removing the barrier film 12 and the conductive film 13 outside the wiring grooves D100A and D100B (step 107). In other words, the heater is formed in steps 101 to 104, whereas the wiring parts are formed in steps 105 to 107.

With this configuration, the semiconductor device SD100 includes the heater HT 100 in the insulating film 17 above the optical waveguide OL formed in a part of the SOI substrate 10, so that the heater HT 100 and the wiring parts M100A and M100B for supplying power to the heater HT 100 need to be formed in different steps.

In the method of manufacturing, in particular, the semiconductor device SD100 that includes the heater HT 100 in the insulating film 17 above the optical waveguide OL formed in a part of the SOI substrate 10, a number of steps are necessary for forming the heater HT 100 and the wiring parts M100A and M100B. For this reason, it is desirable to reduce the manufacturing cost of the semiconductor device by shortening the step of forming the heater and the step of forming the wiring parts.

Main Characteristics of the Embodiment

As shown in FIG. 1, in the semiconductor device SD1 of the first embodiment, the thickness THT1 of the thin film part HT1 is smaller than the thickness THM1 of the pair of wiring parts M1A and M1B. In other words, the thin film part HT1 has a larger resistance than the pair of wiring parts M1A and M1B. Thus, the thin film part HT1 can be used as a heater for changing the temperature of the optical waveguide OL.

In the method of manufacturing the semiconductor device SD1 according to the first embodiment, in order to form the thin film part HT1 above the optical waveguide OL formed in a part of the SOI substrate 10, the following steps are necessary: forming the wiring groove D1 by patterning the interlayer insulating film 11 covering the optical waveguide OL (step 11), forming the wiring grooves D2A and D2B by patterning the interlayer insulating film 11 (step 12), forming the barrier film 12 and the conductive film 13 on the interlayer insulating film 11 (step 13), and forming the thin film part HT1 and the wiring parts M1A and M1B by removing the barrier film 12 and the conductive film 13 outside the wiring grooves D1, D2A, and D2B (step 14). In other words, the thin film part and the wiring parts are formed in steps 11 to 14 of the first embodiment.

As shown in FIG. 11, the depth Dd1 of the wiring groove D1 formed in step 11 is particularly smaller than the depth Dd2 of the wiring grooves D2A, D2B, and D2C formed in step 12. Moreover, as shown in FIG. 11, both ends of the wiring groove D1 in the longitudinal direction continue to the wiring grooves D2A and D2B. Thus, as shown in FIGS. 14 and 15, the barrier film 12 is left so as to be integrated with the interiors of the wiring groove D1 and the wiring grooves D2A and D2B. Hence, as shown in FIGS. 14 and 15, the barrier film 12 of the thin film part HT1 and the barrier film 12 of the wiring parts M1A and M1B are integrated with each other.

As described above, in the method of manufacturing the semiconductor device SD1 of the first embodiment, the step of forming the wiring groove D1 having a smaller depth than the wiring grooves D2A and D2B (step 11) is performed before the step of forming the wiring grooves D2A and D2B (step 12), so that the wiring parts M1A and M1B and the thin film part HT1 are integrated with each other. Hence, in the method of manufacturing the semiconductor device SD1 according to the first embodiment, it is not necessary to form the wiring parts M1A and M1B and the thin film part HT1 in different steps unlike in the steps of forming the heater (steps 101 to 104) and the steps of forming the wiring parts (steps 105 to 107) in the method of manufacturing the semiconductor device SD100 according to the study example. In the first embodiment, in particular, the thin film part HT1 is formed using the wiring groove D1, eliminating the need for the step of forming the heater HT 100 by patterning the titanium nitride film 16 through etching (step 102) in the study example.

Moreover, the pair of wiring parts M1A and M1B and the thin film part HT1 are formed on the same wiring part layer (on the interlayer insulating film 11), eliminating the need for the steps of forming another interlayer insulating film on the thin film part HT1, forming the pair of wiring parts M1A and M1B on the interlayer insulating film, and electrically coupling the pair of wiring parts M1A and M1B and the thin film part HT1 via a coupling plug through a contact hole formed on the interlayer insulating film.

In the method of manufacturing the semiconductor device SD100 according to the study example, the heater HT 100 is formed in step 102 and then the wiring grooves D100A and D100B are formed in step 105. Thus, the interlayer insulating film 17 needs to be etched after the interlayer insulating film 17 is deposited on the heater HT 100 (step 103) and the top surface of the interlayer insulating film 17 is flattened (step 104).

In contrast, in the method of manufacturing the semiconductor device SD1 according to the first embodiment, the step of forming the wiring groove D1 (step 11) and the step of forming the wiring grooves D2A and D2B (step 12) are successively performed, eliminating the need for forming another interlayer insulating film. As shown in FIG. 9, in step 2, the interlayer insulating film 11 having the wiring groove D1 is coated with the anti-reflection coating AF, thereby flattening the top surface of the interlayer insulating film 11. Thus, when the photoresist film PR2 is formed on the interlayer insulating film 11, the step of flattening the top surface of the interlayer insulating film 11 is substantially unnecessary.

As described above, the method of manufacturing the semiconductor device SD1 according to the first embodiment can considerably shorten the process as compared with the method of manufacturing the semiconductor device SD100 according to the study example. Hence, the method of manufacturing the semiconductor device according to the first embodiment can reduce the manufacturing cost of the semiconductor device.

Second Embodiment

Figure 22:
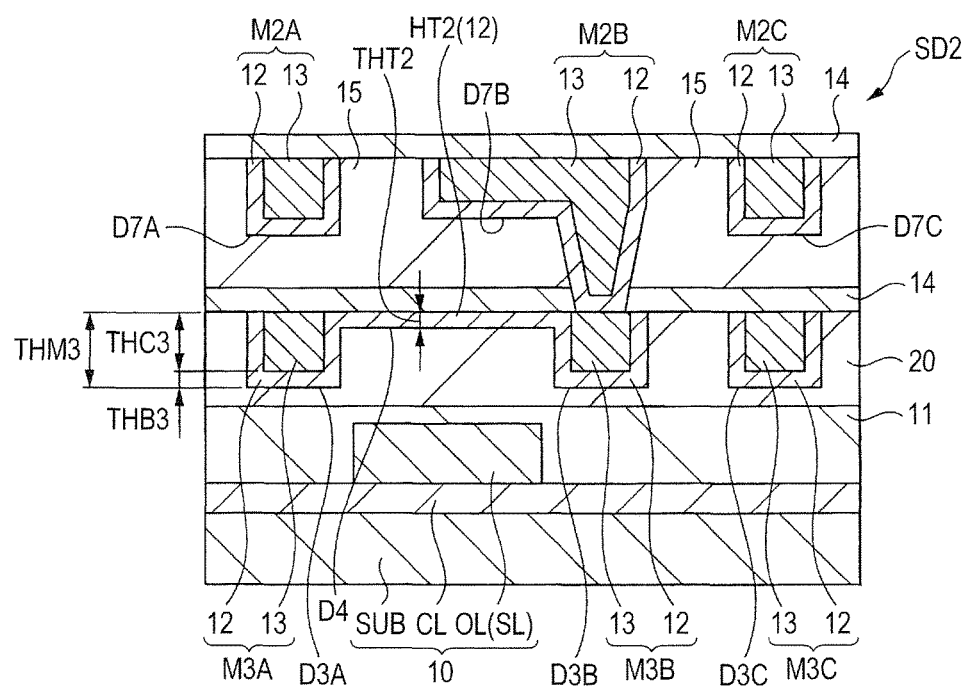
FIG. 22 is a cross-sectional view showing the principal part of a semiconductor device according to a second embodiment.

Referring to FIG. 22, the configuration of a semiconductor device SD2 according to a second embodiment will be described below. FIG. 22 is a cross-sectional view showing the principal part of the semiconductor device SD2 according to the second embodiment.

As shown in FIG. 22, in the semiconductor device SD2 of the second embodiment, a configuration from a substrate SUB to an interlayer insulating film 11 is identical, in the thickness direction, to that of the semiconductor device SD1 of the first embodiment shown in FIG. 1. Specifically, the semiconductor device SD2 of the second embodiment includes the substrate SUB, an insulating layer CL formed on the substrate SUB, and a semiconductor layer SL formed on the insulating layer CL. The substrate SUB, the insulating layer CL, and the semiconductor layer SL form a semiconductor substrate 10 serving as a SOI substrate. On the insulating layer CL, the optical waveguide OL for transmitting an optical signal is formed by patterning a part of the semiconductor layer SL. The interlayer insulating film 11 is formed on the optical waveguide OL.

Unlike the semiconductor device SD1 of the first embodiment, the semiconductor device SD2 of the second embodiment shown in FIG. 22 includes an interlayer insulating film (fourth insulating film) 20 formed on the interlayer insulating film (third insulating film) 11. The interlayer insulating film 20 is made of a material having a lower relative permittivity than silicon oxide, that is, a so-called low-k material. For example, the interlayer insulating film 20 is made of hydrogenated silicon oxycarbide (SiCOH).

As shown in FIG. 22, in the interlayer insulating film 20 provided above the optical waveguide OL, a thin film part HT2 shaped like a planar rectangle is formed such that the thin film part HT2 partially overlaps the optical waveguide OL in a planar configuration. Moreover, a pair of wiring parts M3A and M3B is formed on both ends of the thin film part HT2 in the longitudinal direction. The pair of wiring parts M3A and M3B and the thin film part HT2 are integrated with each other. Thus, the pair of wiring parts M3A and M3B and the thin film part HT2 are electrically coupled to each other. Furthermore, a wiring part M3C is formed with the thin film part HT2 and the pair of wiring parts M3A and M3B on the interlayer insulating film 20. The materials and thicknesses of the wiring parts M3A, M3B, and M3C and the thin film part HT2 according to the second embodiment are identical to those of the wiring parts M1A, M1B, and M1C and the thin film part HT1 according to the first embodiment.

As shown in FIG. 22, the thin film part HT2 is embedded in a wiring groove (second groove) D4 formed on the interlayer insulating film 20. The wiring parts M3A, M3B, and M3C are embedded in wiring grooves (first grooves) D3A, D3B, and D3C, respectively. The wiring grooves D3A, D3B, and D3C are formed on the interlayer insulating film 20.

Moreover, as shown in FIG. 22, the wiring parts M3A, M3B, and M3C and the thin film part HT2 are covered with a protective film 14. As shown in FIG. 22, a configuration above the protective film 14 covering the wiring parts M3A, M3B, and M3C and the thin film part HT2 is identical to that of the semiconductor device SD1 of the first embodiment shown in FIG. 1.

As described above, in the semiconductor device SD2 of the second embodiment, the interlayer insulating film 20 is formed on the interlayer insulating film 11 and the wiring parts M3A, M3B, and M3C and the thin film part HT2 are embedded in the interlayer insulating film 20 made of the low-k material.

In order to improve the working speed and power consumption of the semiconductor device, it is necessary to reduce the resistance and capacity of a wire. For example, a signal delay that considerably affects the working speed is determined by the product of a resistance and a capacity. In order to reduce a resistance and a capacity, it is desirable to use a copper wire having a low resistance and a low-permittivity (low-k) film having a low permittivity. Moreover, in order to reduce a loss occurring in the optical property of the optical waveguide OL, the optical waveguide OL is desirably surrounded by the same material having the same index of refraction. Specifically, the insulating layer CL under the optical waveguide OL is made of silicon oxide and thus the top surface and both sides of the optical waveguide OL are also desirably covered with silicon oxide.

Thus, in the semiconductor device SD2 of the second embodiment, the interlayer insulating film that covers the optical waveguide OL and includes the embedded thin film part HT2 and the embedded wiring parts M3A, M3B, and M3C has a double-layer structure of the interlayer insulating film 11 that is made of silicon oxide and the interlayer insulating film 20 that is made of a material having a lower relative permittivity than silicon oxide. With this configuration, the interlayer insulating film 11 around the optical waveguide OL is made of silicon oxide; meanwhile, the interlayer insulating film 20 around the wiring parts M3A, M3B, and M3C and the thin film part HT2 can be made of a material having a lower relative permittivity than silicon oxide.

Hence, as compared with the semiconductor device SD1 of the first embodiment in which the wiring parts M1A, M1B, and M1C and the thin film part HT1 are formed on the interlayer insulating film 11 made of silicon oxide, the semiconductor device SD2 of the second embodiment can reduce a wiring delay on the wiring parts M3A, M3B, and M3C and the thin film part HT2 while preventing a loss of the optical property of the optical waveguide OL.

Except for the interlayer insulating film 11 and the interlayer insulating film 20, the configuration of the semiconductor device SD2 according to the second embodiment is identical to that of the first embodiment and has the same effect as the semiconductor device SD1 of the first embodiment.

Figure 23:
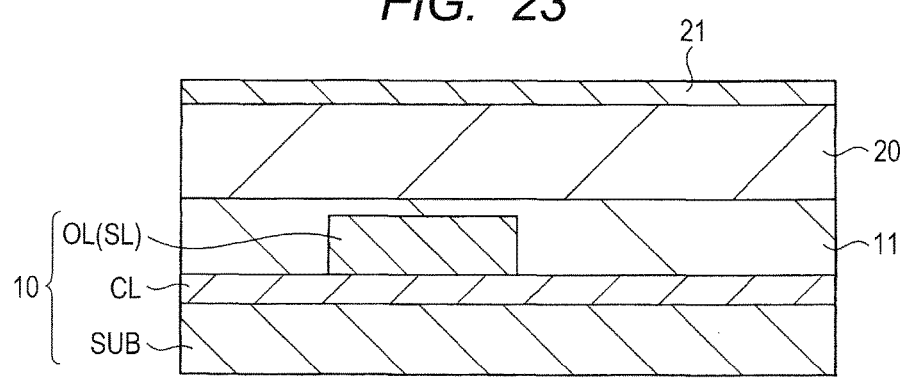
FIG. 23 is a cross-sectional view showing the principal part of the semiconductor device in the manufacturing process according to the second embodiment.
Figure 24:
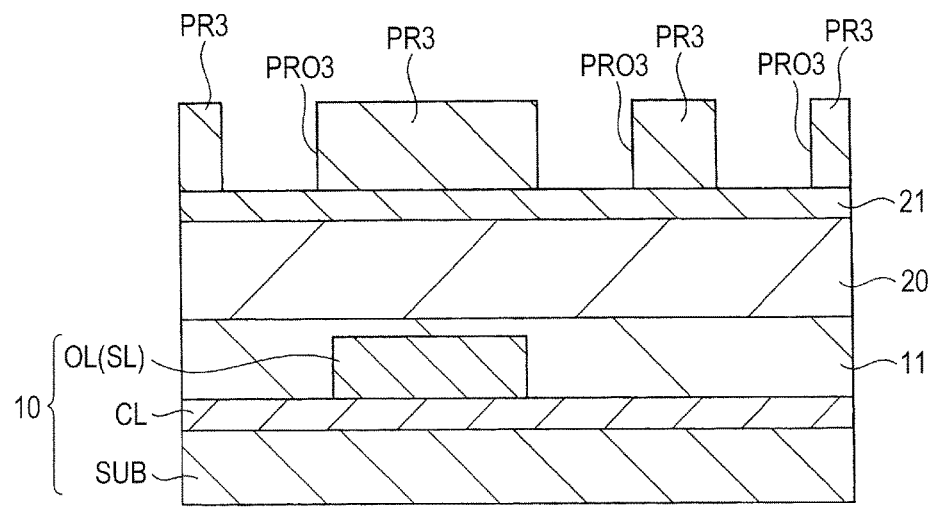
FIG. 24 is a cross-sectional view showing the principal part of the semiconductor device in the manufacturing process, subsequently to FIG. 23, according to the second embodiment.
Figure 25:
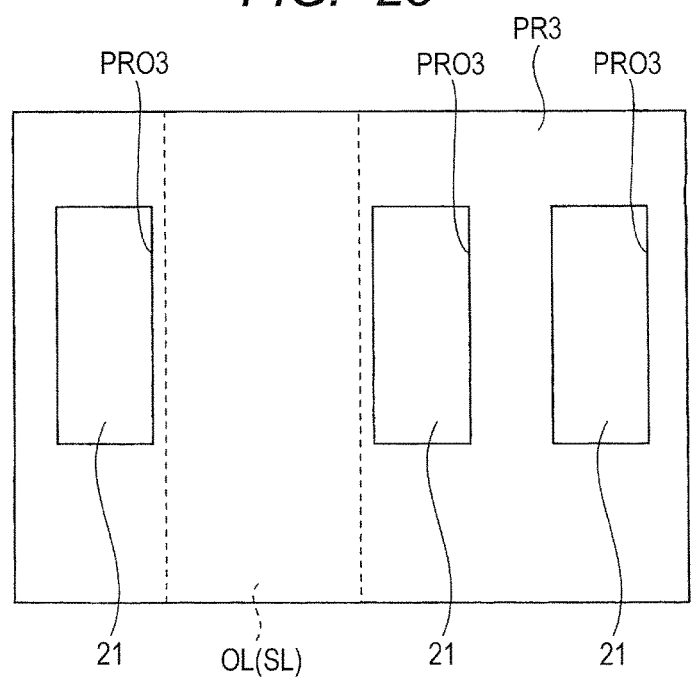
FIG. 25 is a plan view showing the manufacturing process of the semiconductor device, subsequently to FIG. 23, according to the second embodiment.
Figure 26:
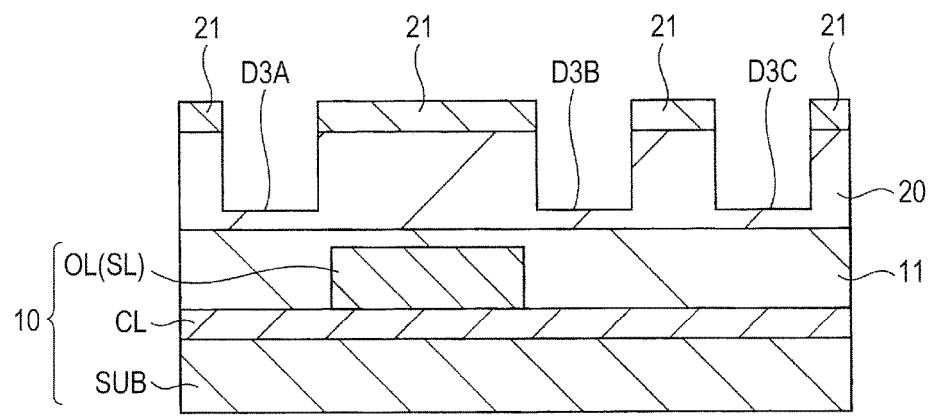
FIG. 26 is a cross-sectional view showing the principal part of the semiconductor device in the manufacturing process, subsequently to FIGS. 24 and 25, according to the second embodiment.
Figure 27:
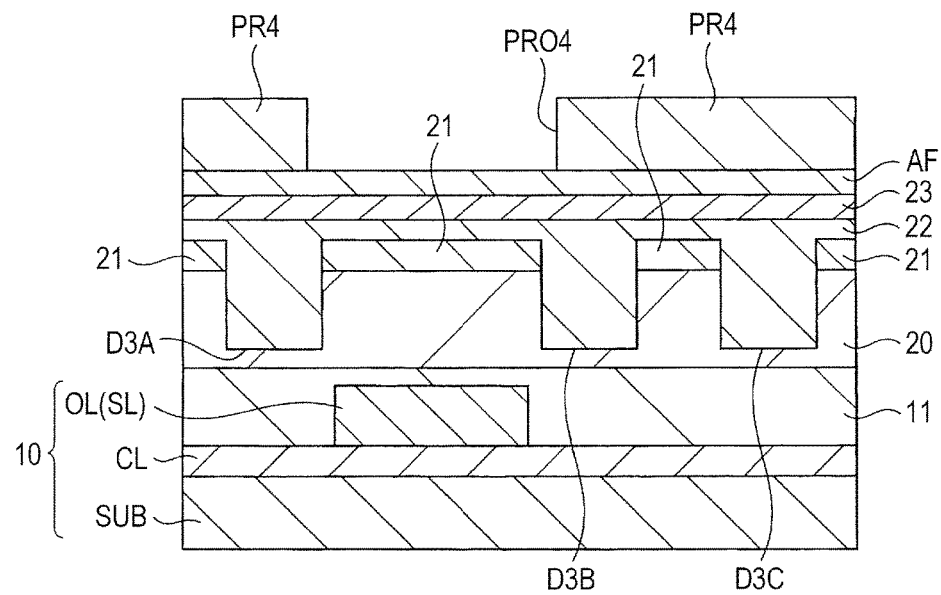
FIG. 27 is a cross-sectional view showing the principal part of the semiconductor device in the manufacturing process, subsequently to FIG. 26, according to the second embodiment.
Figure 28:
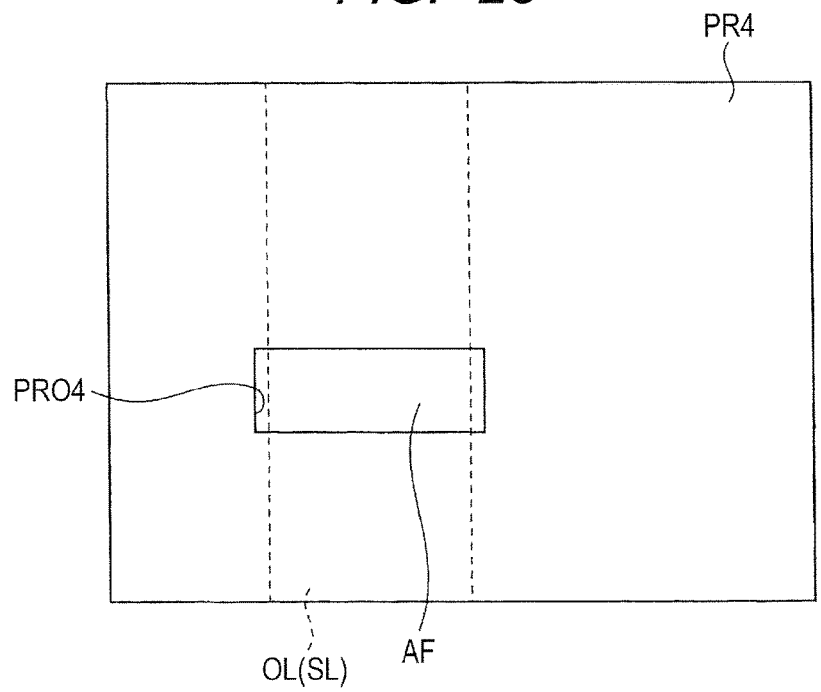
FIG. 28 is a plan view showing the manufacturing process of the semiconductor device, subsequently to FIG. 26, according to the second embodiment.

Referring to FIGS. 23 to 31, a method of manufacturing the semiconductor device SD2 according to the second embodiment will be described below in the order of steps. FIGS. 23, 24, 26, 27, and 29 to 31 are cross-sectional views showing the principal part of the semiconductor device SD2 in the manufacturing process according to the second embodiment. FIGS. 25 and 28 are plan views showing the semiconductor device SD2 in the manufacturing process according to the second embodiment.

As described above, from the substrate SUB to the interlayer insulating film 11, the configuration of the semiconductor device SD2 of the second embodiment in FIG. 22 is identical to the semiconductor device SD1 of the first embodiment shown in FIG. 1. Hence, from the preparation of the SOI substrate 10 to the deposition of the interlayer insulating film 11, the method of manufacturing the semiconductor device SD2 according to the second embodiment is identical to the steps of the method of manufacturing the semiconductor device SD1 according to the first embodiment.

Thereafter, as shown in FIG. 23, the interlayer insulating film 20 made of hydrogenated silicon oxycarbide (SiCOH), that is, a low-k material is deposited on the interlayer insulating film 11. Subsequently, the interlayer insulating film (fifth insulating film) 21 made of silicon oxide is deposited on the interlayer insulating film 20 by CVD. The interlayer insulating film 20 made of hydrogenated silicon oxycarbide (SiCOH) has a hydrophobic group including an alkyl group, and thus a photoresist film is repelled and is hardly fixed. Moreover, the interlayer insulating film 20 made of hydrogenated silicon oxycarbide (SiCOH) is likely to be affected by etching or oxygen ashing in which an organic solvent is used for peeling a photoresist film. Thus, the interlayer insulating film 21 made of silicon oxide is formed on the interlayer insulating film 20, allowing the formation of a photoresist film on the interlayer insulating film 20 and the protection of the interlayer insulating film 20 from etching or oxygen ashing using an organic solvent. Furthermore, an anti-reflection coating may be formed on the interlayer insulating film 21.

Subsequently, as shown in FIGS. 24 and 25, a photoresist film PR3 is formed on the interlayer insulating film 21. The interlayer insulating film 21 and the interlayer insulating film 20 are dry-etched through opening parts PRO3 of the photoresist film PR3 with the photoresist film PR3 serving as a mask, so that the interlayer insulating film 20 is patterned. This forms the wiring grooves D3A, D3B, and D3C on the interlayer insulating film 20 as shown in FIG. 26.

After the removal of the photoresist film PR3, as shown in FIG. 27, a photoresist film 22 is formed on the interlayer insulating film 20 and the interlayer insulating film 21 where the wiring grooves D3A, D3B, and D3C are formed. The wiring grooves D3A, D3B, and D3C of the interlayer insulating film 20 are filled with the photoresist film 22 and are flattened. In this configuration, the photoresist film 22 is embedded in the wiring grooves D3A, D3B, and D3C of the interlayer insulating film 20 such that the photoresist film 22 protects the interlayer insulating film 20. Thus, the photoresist film 22 is preferably a photoresist film that can be properly embedded with high heat resistance.

Thereafter, a low temperature oxide (LTO) film 23 is deposited on the photoresist film 22 by plasma CVD. In this configuration, hydrogenated silicon oxycarbide (SiCOH) making up the interlayer insulating film 20 tend to absorb various substances. Thus, the formation of the LTO film 23 on the photoresist film 22 can prevent a substance released from the interlayer insulating film 20 under the photoresist film 22 from reacting with a photoresist film PR4 formed on the LTO film 23, which will be discussed later, and reducing the resolution of dry etching.

Subsequently, the top surface of the LTO film 23 is coated with an anti-reflection coating AF. Moreover, as shown in FIGS. 27 and 28, the photoresist film PR4 is formed on the anti-reflection coating AF. The anti-reflection coating AF, the LTO film 23, the interlayer insulating film 21, and the interlayer insulating film 20 are dry-etched through an opening part PRO4 of the photoresist film PR4 with the photoresist film PR4 serving as a mask. Thus, as shown in FIG. 29, the wiring groove D4 (first groove) is formed on the interlayer insulating film 20 and above the optical waveguide OL such that the wiring groove D4 overlaps the optical waveguide OL in a planar configuration.

Figure 29:
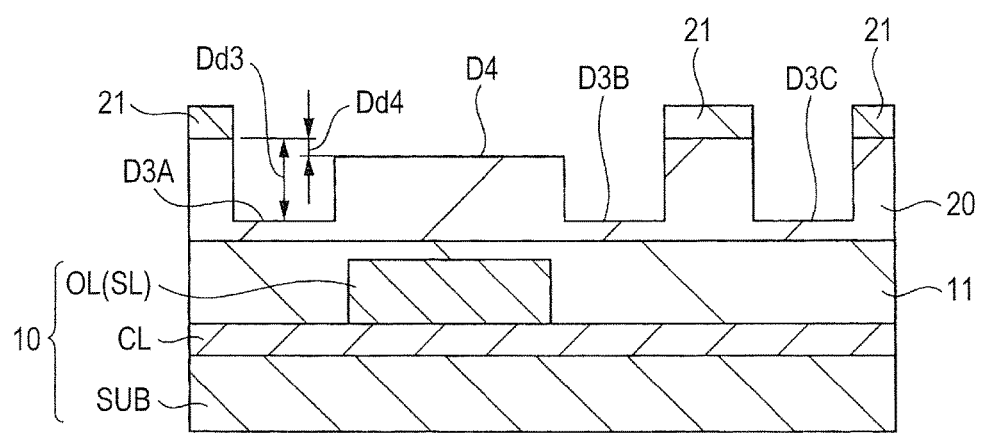
FIG. 29 is a cross-sectional view showing the principal part of the semiconductor device in the manufacturing process, subsequently to FIGS. 27 and 28, according to the second embodiment.

In this configuration, as shown in FIG. 29, the wiring grooves D3A, D3B, and D3C have an equal depth Dd3 relative to the top surface of the interlayer insulating film 20 before patterning. Moreover, a depth Dd4 of the wiring groove D4 is smaller than the depth Dd3 of the wiring grooves D3A, D3B, and D3C relative to the top surface of the interlayer insulating film 20 before patterning.

Furthermore, as shown in FIG. 27, the opening part PRO4 of the photoresist film PR4 partially overlaps the wiring grooves D3A and D3B in a planar configuration. Thus, as shown in FIG. 29, both ends of the wiring groove D4 in the longitudinal direction continue to the wiring grooves D3A and D3B.

Figure 30:
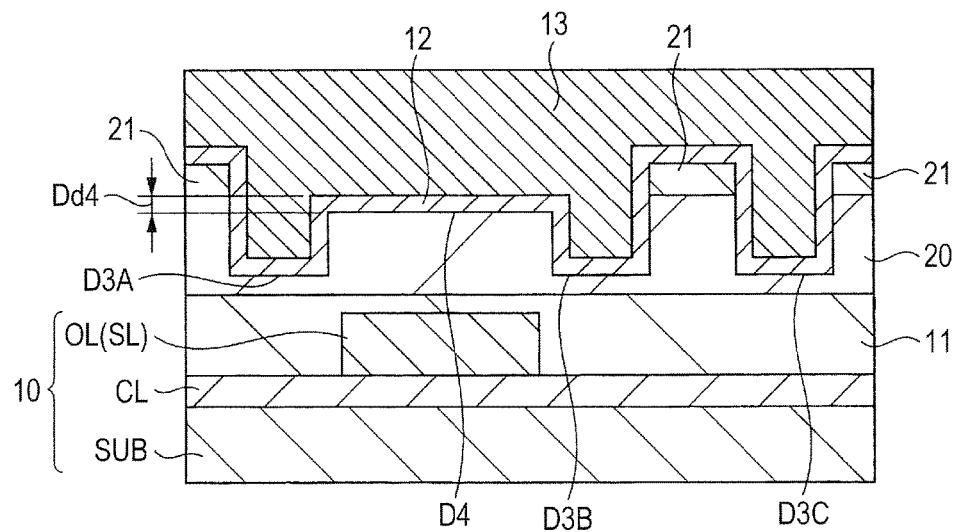
FIG. 30 is a cross-sectional view showing the principal part of the semiconductor device in the manufacturing process, subsequently to FIG. 29, according to the second embodiment.

Subsequently, as shown in FIG. 30, a barrier film 12 is formed on the interlayer insulating film 20 and the interlayer insulating film 21 by sputtering. Furthermore, a seed film (not shown) made of copper is formed on the barrier film 12 by sputtering. Thereafter, a conductive film 13 is formed on the seed film (not shown) by electrolytic plating. In this configuration, as shown in FIG. 30, the barrier film 12 has the same thickness as the depth Dd4 of the wiring groove D4.

Figure 31:
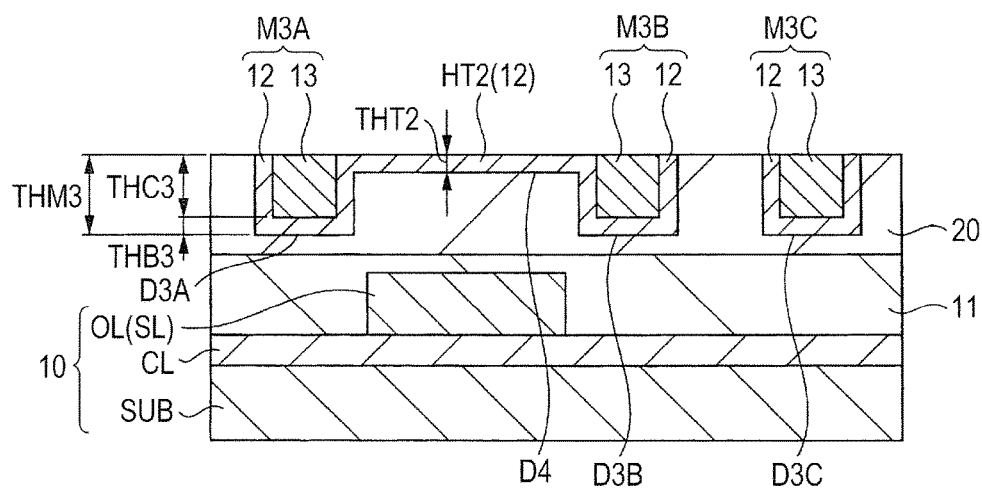
FIG. 31 is a cross-sectional view showing the principal part of the semiconductor device in the manufacturing process, subsequently to FIG. 30, according to the second embodiment.

Thereafter, as shown in FIG. 31, the barrier film 12 and the conductive film 13 are removed outside the wiring grooves D3A, D3B, D3C, and D4 by CMP method. As described above, the barrier film 12 has the same thickness as the depth Dd4 of the wiring groove D4 and thus after the removal of the barrier film 12 and the conductive film 13 outside the wiring groove D4, only the barrier film 12 is left in the wiring groove D4. Moreover, the depth Dd3 of the wiring grooves D3A, D3B, and D3C is larger than the depth Dd4 of the wiring groove D4 and thus after the removal of the barrier film 12 and the conductive film 13 outside the wiring grooves D3A, D3B, and D3C, both of the barrier film 12 and the conductive film 13 are left in each of the wiring grooves D3A, D3B, and D3C. Hence, the wiring parts M3A, M3B, and M3C, each of which includes the barrier film 12 and the conductive film 13, are formed in the wiring grooves D3A, D3B, and D3C, respectively. In the wiring groove D4, the thin film part HT2 is formed concurrently with the wiring parts M3A, M3B, and M3C. The thin film part HT2 includes the barrier film 12 and has a smaller thickness than the wiring parts M3A, M3B, and M3C.

As shown in FIG. 29, both ends of the wiring groove D4 in the longitudinal direction continue to the wiring grooves D3A and D3B. Thus, as shown in FIG. 31, the barrier film 12 is left so as to be integrated with the interiors of the wiring groove D4 and the wiring grooves D3A and D3B. Hence, as shown in FIG. 31, the barrier film 12 of the thin film part HT2 and the barrier film 12 of the wiring parts M3A and M3B are integrated with each other.

As shown in FIGS. 30 and 31, when the barrier film 12 and the conductive film 13 outside the wiring grooves D3A, D3B, D3C, and D4 are removed by CMP method, the top surface of the interlayer insulating film 20 is polished before patterning. Thus, the partially left interlayer insulating film 21 is also removed at the same time. The polishing amount of CMP method, the depth Dd4 of the wiring groove D4, or the thickness of the barrier film 12 is changed so as to only remove the conductive film 13 and the barrier film 12, which are formed on the interlayer insulating film 21, without removing the interlayer insulating film 21.

As shown in FIG. 31, the thin film part HT2 has a smaller thickness than the wiring parts M3A, M3B, and M3C. The thin film part HT2 has a thickness THT2 that is equal to the depth Dd4 of the wiring groove D4. Moreover, a thickness THM3 of the wiring parts M3A, M3B, and M3C is the sum of a thickness THB3 of the barrier film 12 constituting the wiring parts M3A, M3B, and M3C and a thickness THC3 of the conductive film 13 constituting the wiring parts M3A, M3B, and M3C. The thickness THM3 is equal to the depth Dd3 of the wiring grooves D3A, D3B, and D3C. Furthermore, the thickness THB3 of the barrier film 12 constituting the wiring parts M3A, M3B, and M3C is equal to the thickness THT2 of the thin film part HT2. Thus, as shown in FIG. 31, the thickness THT2 of the thin film part HT2 is smaller than the thickness THM3 of the wiring parts M3A, M3B, and M3C by the thickness THC3 of the conductive film 13 constituting the wiring parts M3A, M3B, and M3C.

Thereafter, as shown in FIG. 22, the protective film 14 made of silicon carbonitride (SiCN) or silicon nitride ($Si_3N_4$) is formed on the interlayer insulating film 20 by CVD. The wiring parts M3A, M3B, and M3C and the thin film part HT2 are covered with the protective film 14.

As shown in FIG. 22, a configuration above the protective film 14 covering the wiring parts M3A, M3B, and M3C and the thin film part HT2 is identical to that of the semiconductor device SD1 of the first embodiment shown in FIG. 1. Hence, from the deposition of the interlayer insulating film 15 to the formation of the protective film 14 on the wiring parts M2A, M2B, and M2C, the method of manufacturing the semiconductor device SD2 according to the second embodiment is identical to the method of manufacturing the semiconductor device SD1 according to the first embodiment.

A difference between the method of manufacturing the semiconductor device SD2 according to the second embodiment and the method of manufacturing the semiconductor device SD1 according to the first embodiment will be discussed below.

On the other, hand, in the method of manufacturing the semiconductor device SD1 according to the first embodiment, in order to form the thin film part HT1 above the optical waveguide OL formed in a part of the SOI substrate 10, the following steps are necessary: forming the wiring groove D1 by patterning the interlayer insulating film 11 covering the optical waveguide OL (step 11), forming the wiring grooves D2A, D2B, and D2C by patterning the interlayer insulating film 11 (step 12), forming the barrier film 12 and the conductive film 13 on the interlayer insulating film 11 (step 13), and forming the thin film part HT1 and the wiring parts M1A, M1B, and M1C by removing the barrier film 12 and the conductive film 13 outside the wiring grooves D1, D2A, D2B, and D2C (step 14).

In the method of manufacturing the semiconductor device SD2 according to the second embodiment, in order to form the thin film part HT2 above the optical waveguide OL formed in a part of the SOI substrate 10, the following steps are necessary: forming the wiring grooves D3A, D3B, and D3C by patterning the interlayer insulating film 20 covering the optical waveguide OL (step 21); forming the wiring groove D4 by patterning the interlayer insulating film 20 (step 22); forming the barrier film 12 and the conductive film 13 on the interlayer insulating film 20 (step 23); and forming the thin film part HT2 and the wiring parts M3A, M3B, and M3C by removing the barrier film 12 and the conductive film 13 outside the wiring grooves D4, D3A, D3B, and D3C (step 24).

In other words, the method of manufacturing the semiconductor device SD1 according to the first embodiment has the step of forming the wiring grooves D2A, D2B, and D2C (step 12) after the step of forming the wiring groove D1 (step 11). Thus, as shown in FIGS. 9 and 11, the wiring groove D1 is subjected to etching with an organic solvent or oxygen ashing during the removal of the photoresist film PR2 in step 12 as well as the removal of the photoresist film PR1 in step 11. Thus, the wiring grooves D2A, D2B, and D2C are subjected to etching with an organic solvent or oxygen ashing one time, whereas the wiring groove D1 is subjected to etching or oxygen ashing twice.

Unlike in the first embodiment, the method of manufacturing the semiconductor device SD2 according to the second embodiment has the step of forming the wiring groove D4 (step 22) after the step of forming the wiring grooves D3A, D3B, and D3C. Thus, as shown in FIGS. 27 and 29, the wiring grooves D3A, D3B, and D3C are subjected to etching with an organic solvent or oxygen ashing during the removal of the photoresist film PR4 in step 22 as well as the removal of the photoresist film PR3 in step 21.

Hence, the wiring groove D4 is subjected to etching with an organic solvent or oxygen ashing one time, whereas the wiring grooves D3A, D3B, and D3C are subjected to etching or oxygen ashing twice.

In the semiconductor device SD2 of the second embodiment, the wiring grooves D3A, D3B, and D3C having the wiring parts M3A, M3B, and M3C are and the wiring groove D4 having the thin film part HT2 are formed on the interlayer insulating film 20 made of hydrogenated silicon oxycarbide (SiCOH) that is a low-k material. As described above, the interlayer insulating film 20 made of hydrogenated silicon oxycarbide (SiCOH) tends to be damaged by an organic solvent or oxygen plasma that is used for peeling the photoresist film. Specifically, a hydrocarbon radical contained in hydrogenated silicon oxycarbide (SiCOH) is eliminated by an organic solvent or oxygen plasma, causing a dangling bond of silicon. The dangling bond is likely to react with water. A hydroxyl group is bonded to the dangling bond after the reaction. The presence of the hydroxyl group increases the moisture absorption of the damaged interlayer insulating film 20.

As shown in FIGS. 22 and 31, the barrier film 12 constituting the thin film part HT2 is in contact with the wiring groove D4. Thus, if moisture is absorbed by the part of the wiring groove D4 in the interlayer insulating film 20, moisture contained in the interlayer insulating film 20 may oxidize the barrier film 12. If the barrier film 12 constituting the thin film part HT2 is oxidized, the oxidization may change the resistance value of the thin film part HT2 and the characteristics of the thin film part HT2 acting as a heater, thereby precluding the designed performance. Thus, it is desirable to minimize damage to the wiring groove D4 when the damage is caused by etching with an organic solvent or oxygen ashing on the wiring groove D4.

Hence, in the method of manufacturing the semiconductor device SD2 according to the second embodiment, the wiring grooves D3A, D3B, and D3C are formed (step 21) and then the wiring groove D4 is formed (step 22), so that the wiring groove D4 needs to be subjected to etching with an organic solvent or oxygen ashing only once. This can minimize the influence of etching with an organic solvent or oxygen ashing on the wiring groove D4, thereby precluding oxidation of the barrier film 12 constituting the thin film part HT2 so as to prevent deterioration of the performance of the thin film part HT2 acting as a heater.

Third Embodiment

Figure 32:
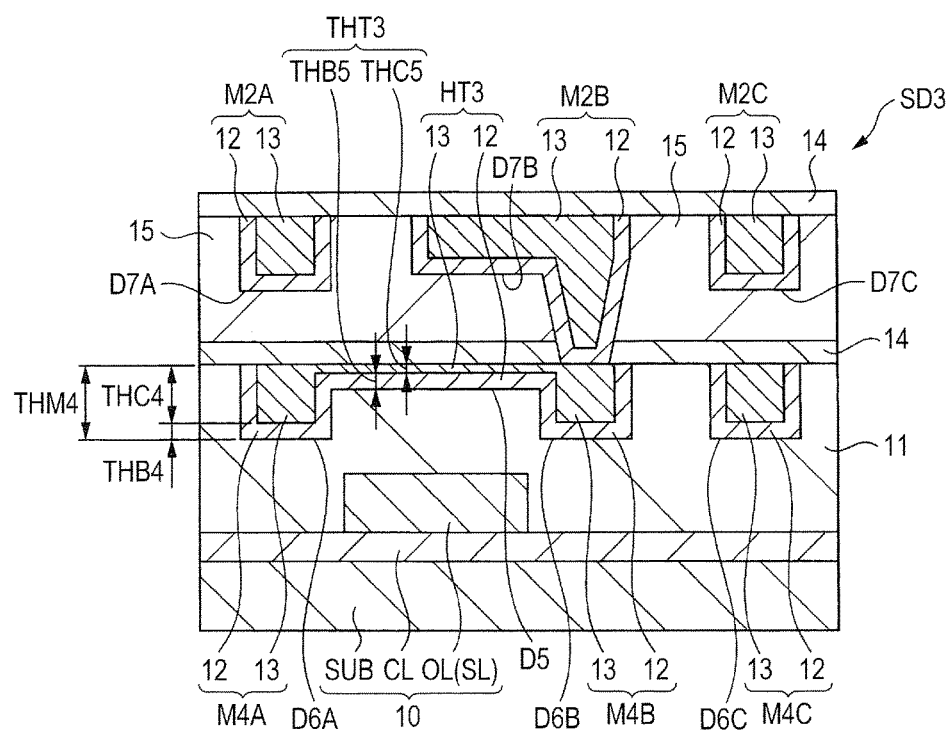
FIG. 32 is a cross-sectional view showing the principal part of a semiconductor device according to a third embodiment.

Referring to FIG. 32, the configuration of a semiconductor device SD3 according to a second embodiment will be described below. FIG. 32 is a cross-sectional view showing the principal part of the semiconductor device SD3 according to the third embodiment.

As shown in FIG. 32, in the semiconductor device SD3 of the second embodiment, a configuration from a substrate SUB to an interlayer insulating film 11 is identical, in the thickness direction, to that of the semiconductor device SD1 of the first embodiment shown in FIG. 1. Specifically, the semiconductor device SD3 of the third embodiment includes the substrate SUB, an insulating layer CL formed on the substrate SUB, and a semiconductor layer SL formed on the insulating layer CL. The substrate SUB, the insulating layer CL, and the semiconductor layer SL form a semiconductor substrate 10 serving as a SOI substrate. On the insulating layer CL, the optical waveguide OL for transmitting an optical signal is formed by patterning a part of the semiconductor layer SL. The interlayer insulating film 11 is formed on the optical waveguide OL.

As shown in FIG. 32, in the interlayer insulating film 11 provided above the optical waveguide OL, a thin film part HT3 shaped like a planar rectangle is formed such that the thin film part HT3 partially overlaps the optical waveguide OL in a planar configuration. Moreover, a pair of wiring parts M4A and M4B is formed on both ends of the thin film part HT3 in the longitudinal direction. The pair of wiring parts M4A and M4B and the thin film part HT3 are integrated with each other. Thus, the pair of wiring parts M4A and M4B and the thin film part HT3 are electrically coupled to each other. Furthermore, a wiring part M4C is formed with the thin film part HT3 and the pair of wiring parts M4A and M4B on the interlayer insulating film 11. The materials and thicknesses of the wiring parts M4A, M4B, and M4C according to the third embodiment are identical to those of the wiring parts M1A, M1B, and M1C according to the first embodiment. Moreover, a shown in FIG. 32, the thin film part HT3 has a smaller thickness than the wiring parts M4A, M4B, and M4C.

In the semiconductor device SD3 of the third embodiment shown in FIG. 32, the wiring parts M4A, M4B, and M4C respectively include a laminated film of a barrier film 12 and a conductive film 13. This configuration is identical to that of the semiconductor device SD1 of the first embodiment. Unlike in the semiconductor device SD1 of the first embodiment, the thin film part HT3 includes the laminated film of the barrier film 12 and the conductive film 13 in the semiconductor device SD3 of the third embodiment shown in FIG. 32. Moreover, the barrier film 12 of the wiring parts M4A, M4B, and M4C and the barrier film 12 of the thin film part HT3 are integrated with each other, and the conductive film 13 of the wiring parts M4A, M4B, and M4C and the conductive film 13 of the thin film part HT3 are integrated with each other. In other words, the barrier film 12 and the conductive film 13 are conductive films constituting parts of the wiring parts M4A, M4B, and M4C and conductive films constituting the thin film part HT3 for heating the optical waveguide OL.

As shown in FIG. 32, the thin film part HT3 is embedded in a wiring groove (first groove) D5 formed on the interlayer insulating film 11. The wiring parts M4A, M4B, and M4C are embedded in wiring grooves (second grooves) D6A, D6B, and D6C, respectively. The wiring grooves D6A, D6B, and D6C are formed on the interlayer insulating film 11.

As shown in FIG. 32, the thin film part HT3 has a smaller thickness than the wiring parts M4A, M4B, and M4C. Moreover, a thickness THT3 of the thin film part HT3 is the sum of a thickness THB5 of the barrier film 12 constituting the thin film part HT3 and a thickness THC5 of the conductive film 13 constituting the thin film part HT3. The thickness THT3 is equal to a depth Dd5 of a wiring groove D5 shown in FIG. 33. Furthermore, a thickness THM4 of the wiring parts M4A, M4B, and M4C is the sum of a thickness THB4 of the barrier film 12 constituting the wiring parts M4A, M4B, and M4C and a thickness THC4 of the conductive film 13 constituting the wiring parts M4A, M4B, and M4C. The thickness THM4 is equal to a depth Dd6 of the wiring grooves D6A, D6B, and D6C shown in FIG. 33. The thickness THB4 of the barrier film 12 constituting the wiring parts M4A, M4B, and M4C is equal to the thickness THB5 of the barrier film 12 constituting the thin film part HT3. Thus, as shown in FIG. 32, the conductive film 13 constituting the thin film part HT3 is smaller in thickness than the conductive film 13 constituting the wiring parts M4A, M4B, and M4C.

Moreover, as shown in FIG. 32, the wiring parts M4A, M4B, and M4C and the thin film part HT3 are covered with a protective film 14. As shown in FIG. 32, a configuration above the protective film 14 covering the wiring parts M4A, M4B, and M4C and the thin film part HT3 is identical to that of the semiconductor device SD1 of the first embodiment shown in FIG. 1.

As described above, in the semiconductor device SD3 of the third embodiment, the thickness THT3 of the thin film part HT3 is smaller than the thickness THM4 of the pair of wiring parts M4A and M4B. Specifically, the thickness THB4 of the barrier film 12 constituting the wiring parts M4A, M4B, and M4C is equal to the thickness THB5 of the barrier film 12 constituting the thin film part HT3. As shown in FIG. 32, the thickness THC5 of the conductive film 13 constituting the thin film part HT3 is smaller than the thickness THC4 of the conductive film 13 constituting the wiring parts M4A, M4B, and M4C.

In other words, the thin film part HT3 has a larger resistance than the pair of wiring parts M4A and M4B. Thus, like the thin film part HT1 of the first embodiment, the thin film part HT3 can be used as a heater for changing the temperature of the optical waveguide OL.

The semiconductor device SD3 of the third embodiment is identical to the configuration of the first embodiment except for the configuration of the thin film part HT3. The semiconductor device SD3 of the third embodiment has the same effect as the first semiconductor device SD1 of the first embodiment.

Figure 33:
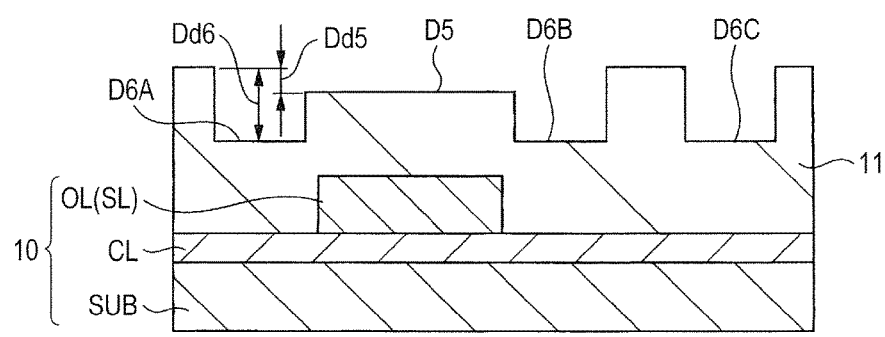
FIG. 33 is a cross-sectional view showing the principal part of the semiconductor device in the manufacturing process according to the third embodiment.
Figure 34:
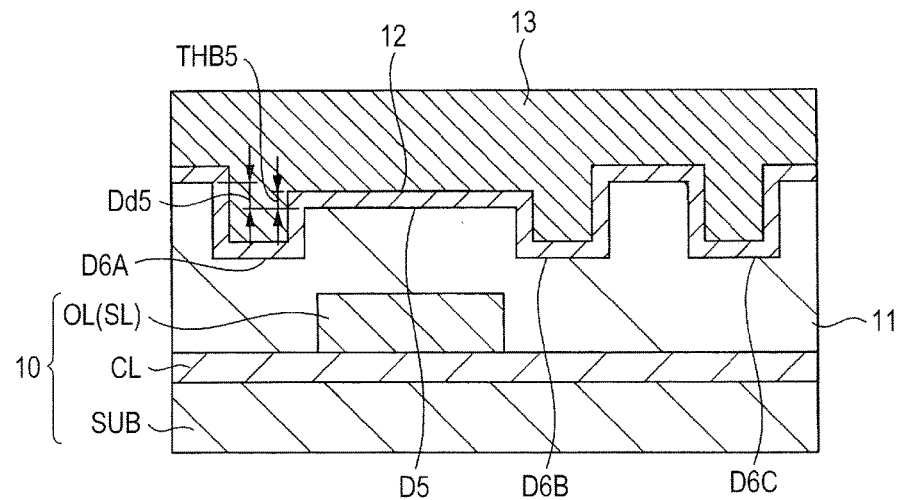
FIG. 34 is a cross-sectional view showing the principal part of the semiconductor device in the manufacturing process, subsequently to FIG. 33, according to the third embodiment.
Figure 35:
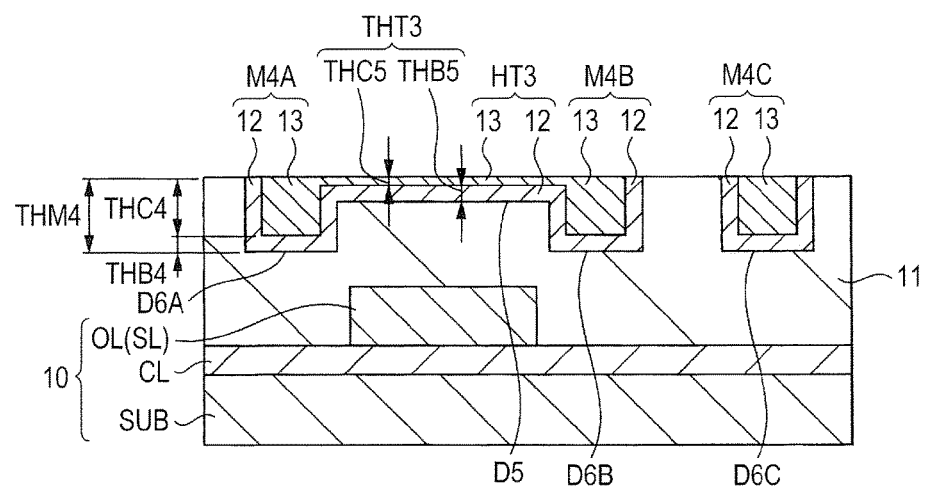
FIG. 35 is a cross-sectional view showing the principal part of the semiconductor device in the manufacturing process, subsequently to FIG. 34, according to the third embodiment.
Figure 36:
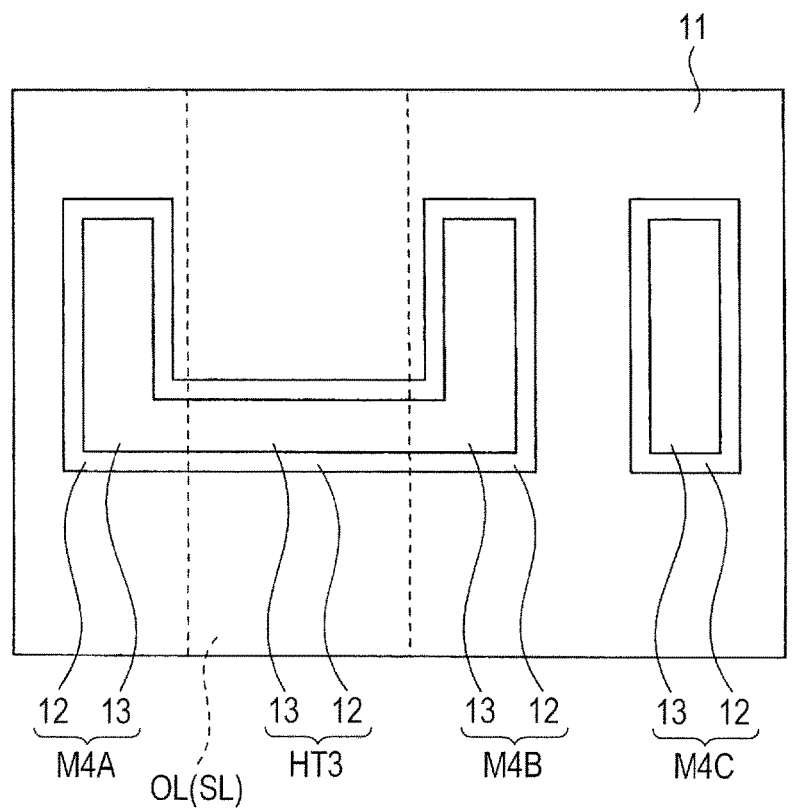
FIG. 36 is a plan view showing the manufacturing process of the semiconductor device, subsequently to FIG. 34, according to the third embodiment.

Referring to FIGS. 33 to 36, a method of manufacturing the semiconductor device SD3 according to the third embodiment will be described below in the order of steps. FIGS. 33 to 35 are cross-sectional views showing the principal part of the semiconductor device SD3 in the manufacturing process according to the third embodiment. FIG. 36 is a plan view showing the semiconductor device SD3 in the manufacturing process according to the third embodiment.

As described above, from the substrate SUB to the interlayer insulating film 11, the configuration of the semiconductor device SD3 of the third embodiment in FIG. 32 is identical to the semiconductor device SD1 of the first embodiment shown in FIG. 1. Hence, from the preparation of the SOI substrate 10 to the deposition of the interlayer insulating film 11, the method of manufacturing the semiconductor device SD3 according to the third embodiment is identical to the steps of the method of manufacturing the semiconductor device SD1 according to the first embodiment.

Moreover, as shown in FIG. 33, the wiring groove D5 is formed on the interlayer insulating film 11 and above the optical waveguide OL by patterning the interlayer insulating film 11 such that the wiring groove D5 overlaps the optical waveguide OL in a planar configuration. The step of forming the wiring groove D5 is identical to the step of forming the wiring groove D1 according to the first embodiment shown in FIGS. 6 to 8. As shown in FIG. 33, the step of forming the wiring grooves D6A, D6B, and D6C by patterning the interlayer insulating film 11 is identical to the step of forming the wiring grooves D2A, D2B, and D2C according to the first embodiment shown in FIGS. 9 to 12.

In this configuration, as shown in FIG. 33, the wiring grooves D6A, D6B, and D6C have an equal depth Dd6 relative to the top surface of the interlayer insulating film 11 before patterning. The depth Dd6 of the wiring grooves D6A, D6B, and D6C is larger than the depth Dd5 of the wiring groove D5. As shown in FIG. 33, both ends of the wiring groove D5 in the longitudinal direction continue to the wiring grooves D6A and D6B. The depth Dd5 of the wiring groove D5 according to the third embodiment shown in FIG. 33 is larger than the depth Dd1 of the wiring groove D1 according to the first embodiment shown in FIG. 1.

Subsequently, as shown in FIG. 34, the barrier film 12 is formed on the interlayer insulating film 11 by sputtering. Furthermore, a seed film (not shown) made of copper is formed on the barrier film 12 by sputtering. Thereafter, the conductive film 13 is formed on the seed film (not shown) by electrolytic plating.

As shown in FIG. 34, the thickness THB5 of the barrier film 12 according to the third embodiment is smaller than the depth Dd5 of the wiring groove D5. As described above, the depth Dd5 of the wiring groove D5 according to the third embodiment shown in FIG. 33 is larger than the depth Dd1 of the wiring groove D1 according to the first embodiment. Thus, if the barrier film 12 of the third embodiment has the same thickness as the barrier film 12 of the first embodiment, as shown in FIG. 34, the thickness THB5 of the barrier film 12 is smaller than the depth Dd5 of the wiring groove D5.

Thereafter, as shown in FIG. 35, the barrier film 12 and the conductive film 13 are removed outside the wiring grooves D5, D6A, D6B, and D6C by CMP method. As described above, the film thickness THB5 of the barrier film 12 is smaller than the depth Dd5 of the wiring groove D5 and thus after the removal of the barrier film 12 and the conductive film 13 outside the wiring groove D5, only a part of the barrier film 12 and the conductive film 13 is left in the wiring groove D5.

Moreover, the depth Dd6 of the wiring grooves D6A, D6B, and D6C is larger than the depth Dd5 of the wiring groove D5 and thus after the removal of the barrier film 12 and the conductive film 13 outside the wiring grooves D6A, D6B, and D6C, both of the barrier film 12 and the conductive film 13 are left in each of the wiring grooves D6A, D6B, and D6C. The thickness THC4 of the conductive film 13 left in the wiring grooves D6A, D6B, and D6C is larger than the thickness THC5 of the conductive film 13 left in the wiring groove D5.

Hence, the wiring parts M4A, M4B, and M4C, each of which includes the barrier film 12 and the conductive film 13, are formed in the wiring grooves D6A, D6B, and D6C, respectively. In the wiring groove D5, the thin film part HT3 is formed concurrently with the wiring parts M4A, M4B, and M4C. The thin film part HT3 includes the barrier film 12 and the conductive film 13 and has a smaller thickness than the wiring parts M4A, M4B, and M4C.

Furthermore, as shown in FIG. 33, both ends of the wiring groove D5 in the longitudinal direction continue to the wiring grooves D6A and D6B. Thus, as shown in FIGS. 35 and 36, the barrier film 12 and the conductive film 13 are left so as to be integrated with the interiors of the wiring groove D5 and the wiring grooves D6A and D6B. Hence, as shown in FIGS. 35 and 36, the barrier film 12 and the conductive film 13 of the thin film part HT3 and the barrier film 12 and the conductive film 13 of the wiring parts M4A and M4B are integrated with each other.

Thereafter, as shown in FIG. 32, the protective film 14 made of silicon carbonitride (SiCN) or silicon nitride ($Si_3N_4$) is formed on the interlayer insulating film 11 by CVD. The wiring parts M4A, M4B, and M4C and the thin film part HT3 are covered with the protective film 14.

As shown in FIG. 32, a configuration above the protective film 14 covering the wiring parts M4A, M4B, and M4C and the thin film part HT3 is identical to that of the semiconductor device SD1 of the first embodiment shown in FIG. 1. Hence, from the deposition of the interlayer insulating film 15 to the formation of the protective film 14 on the wiring parts M2A, M2B, and M2C, the method of manufacturing the semiconductor device SD3 according to the third embodiment is identical to the method of manufacturing the semiconductor device SD1 according to the first embodiment.

A difference between the method of manufacturing the semiconductor device SD3 according to the third embodiment and the method of manufacturing the semiconductor device SD1 according to the first embodiment will be discussed below.

In the first embodiment of FIG. 13, the thickness of the barrier film 12 is equal to the depth Dd1 of the wiring groove D1. Thus, as shown in FIG. 14, after the removal of the barrier film 12 and the conductive film 13 outside the wiring groove D1 by CMP method, only the barrier film 12 is left in the wiring groove D1.

In the third embodiment shown in FIG. 34, the thickness THB5 of the barrier film 12 is smaller than the depth Dd5 of the wiring groove D5. Hence, as shown in FIG. 35, after the removal of the barrier film 12 and the conductive film 13 outside the wiring groove D5 by CMP method, the barrier film 12 and the conductive film 13 are partially left in the wiring groove D5.

In order to form the thin film part as a heater capable of heating the optical waveguide OL with high controllability, it is important to control the thickness of the barrier film 12 in the thin film part. However, in CMP method for forming the thin film part, it is difficult to evenly polish the surface of the substrate. Thus, for example, when the barrier film 12 and the conductive film 13 are removed outside the wiring groove D1 by CMP method according to the first embodiment shown in FIG. 14, sufficient polishing is necessary up to the barrier film 12 in the wiring groove D1 in order to securely remove the conductive film 13 on the wiring groove D1 and leave only the barrier film 12 in the wiring groove D1. In this case, it is difficult to previously design the degree of polishing on the barrier film 12 in the wiring groove D1, leading to the difficulty in controlling the thickness of the thin film part HT1 including the barrier film 12 in the wiring groove D1. Thus, the thickness THT1 of the thin film part HT1 including the barrier film 12 is desirably controlled without polishing the barrier film 12 in the wiring groove D1.

Hence, in the method of manufacturing the semiconductor device SD3 according to the third embodiment, the thickness THB5 of the barrier film 12 according to the third embodiment is smaller than the depth Dd5 of the wiring groove D5. Thus, the conductive film 13 is provided on the barrier film 12 in the wiring groove D5. Thus, when the barrier film 12 and the conductive film 13 are removed outside the wiring groove D5 by CMP method, the conductive film 13 is polished before the inside of the wiring groove D5 is polished. Thus, the barrier film 12 is not polished in the presence of the conductive film 13 in the wiring groove D5. In other words, the conductive film 13 in the wiring groove D5 acts as a polishing stopper film (stopper film) for polishing in CMP method.

As described above, in the method of manufacturing the semiconductor device SD3 according to the third embodiment, the barrier film 12 can be formed with a designed thickness by CMP method so as not to be polished in the wiring groove D5. Hence, the thickness THT3 of the thin film part HT3 including the barrier film 12 can be easily controlled.

The conductive film 13 constituting the thin film part HT3 preferably has a large thickness in order to prevent polishing in CMP method on the barrier film 12. However, if the conductive film 13 constituting the thin film part HT3 has an extremely large thickness, the thin film part HT3 decreases in resistance value and is disabled as a heater. Thus, the thickness THC5 of the conductive film 13 constituting the thin film part HT3 is preferably 2 to 50 nm.

Moreover, as shown in FIGS. 32 and 35, the thickness THB4 of the barrier film 12 constituting the wiring parts M4A, M4B, and M4C is equal to the thickness THB5 of the barrier film 12 constituting the thin film part HT3. In this case, in order to reliably prevent diffusion of copper contained in the conductive film 13, the barrier film 12 preferably has a large thickness. If the barrier film 12 of the thin film part HT3 has an extremely large thickness, the thin film part HT3 decreases in resistance and is disabled as a heater. Hence, it is preferable that the barrier film 12 constituting the thin film part HT3 does not have an extremely large thickness. Consequently, the thickness THB4 of the barrier film 12, that is, the thickness THB5 of the barrier film 12 constituting the thin film part HT3 is preferably 10 to 200 nm.

(Modification)

The semiconductor devices according to the first to third embodiments and a modification of the manufacturing methods will be described below.

As has been discussed in the method of manufacturing the semiconductor device according to the second embodiment, the interlayer insulating film 20 made of hydrogenated silicon oxycarbide (SiCOH) tends to be damaged by an organic solvent or oxygen plasma that is used for peeling the photoresist film. The damaged interlayer insulating film increases in moisture absorbency.

In this case, water has a high relative permittivity (about 80 at 20° C.) and thus the interlayer insulating film having absorbed moisture has a higher relative permittivity than in the absence of moisture absorption. Thus, the interlayer insulating film is seriously damaged. A large amount of moisture absorbed by the interlayer insulating film lessens the effect of reducing a wiring delay caused by the use of a low-k material.

As described above, in the semiconductor device SD2 of the second embodiment, the wiring grooves D3A, D3B, and D3C having the wiring parts M3A, M3B, and M3C and the wiring groove D4 having the thin film part HT2 are formed on the interlayer insulating film 20 made of hydrogenated silicon oxycarbide (SiCOH) that is a low-k material. Thus, in order to prevent a delay of the wiring parts M3A, M3B, and M3C, it is desirable to reduce damage to the interlayer insulating film 20 around the wiring parts M3A, M3B, and M3C. Specifically, it is desirable to minimize damage to the wiring grooves D3A, D3B, and D3C having the wiring parts M3A, M3B, and M3C when the damage is caused by etching with an organic solvent or oxygen asking.

Thus, as a modification of the first and second embodiments, a semiconductor device is configured as in the second embodiment (FIG. 22); meanwhile, as in the first embodiment, a method of manufacturing the semiconductor device forms wiring grooves for forming a thin film part and then forms wiring grooves for forming wiring parts.

Hence, the wiring groove for forming the wiring part needs to be subjected to etching with an organic solvent or oxygen ashing only once. This can minimize the influence of etching with an organic solvent or oxygen ashing on the wiring groove for forming the wiring part, thereby reducing damage to the interlayer insulating film around the wiring parts so as to prevent a delay of the wiring parts.

The modification and the embodiments may be implemented in combination.

In the first to third embodiments, the barrier film 12 is illustrated as a laminated film of a tantalum nitride film and a tantalum film but is not limited thereto. For example, the barrier film 12 may be a conductive film made of other materials that prevent (as a barrier) dispersion of metals constituting the conductive film of the wiring part and have the characteristics (e.g., an electric resistance value) of the wiring part. The barrier film 12 may be, for example, a tantalum nitride film or a titanium nitride (TiN) film, a laminated film of a tantalum nitride film and a tantalum film, or a ruthenium (Ru) film.

The invention made by the present inventors was specifically described above according to the foregoing embodiments. Obviously, the present invention is not limited to the embodiments and can be changed in various ways within the scope of the invention.

What is claimed is:

1. A semiconductor device, comprising:
   a substrate;
   a first insulating film formed over the substrate;
   an optical waveguide formed over the first insulating film;
   a second insulating film formed over the first insulating film such that the second insulating film covers the optical waveguide, the second insulating film having a first groove and a second groove deeper than the first groove; and
   a wiring part formed in the second groove and a thin film part formed in the first and second grooves,
   wherein the thin film part is arranged above the optical waveguide, and
   wherein the thin film part has a smaller thickness than the wiring part and is integrated with the wiring part.

2. The semiconductor device according to claim 1, wherein the thin film part is a heater.

3. The semiconductor device according to claim 1, wherein the wiring part includes a laminated film of a barrier film and a conductive film.

4. The semiconductor device according to claim 3, wherein the thin film part includes the barrier film.

5. The semiconductor device according to claim 3, wherein the thin film part includes the laminated film of the barrier film and the conductive film, and
   wherein the conductive film included in the thin film part has a smaller thickness than the conductive film included in the wiring part.

6. The semiconductor device according to claim 3, wherein the conductive film is formed of copper.

7. The semiconductor device according to claim 3, wherein the barrier film includes a laminated film of a tantalum nitride film and a tantalum film.

8. The semiconductor device according to claim 1, wherein the second insulating film includes a laminated film of a third insulating film and a fourth insulating film, the third insulating film being formed over the first insulating film such that the third insulating film covers the optical waveguide, the fourth insulating film being formed over the third insulating film, and
   wherein the wiring part is embedded in the fourth insulating film.

9. The semiconductor device according to claim 8, wherein the first insulating film and the third insulating film are formed of silicon oxide, and
   wherein the fourth insulating film is formed of a material having a lower relative permittivity than silicon oxide.

10. A method of manufacturing a semiconductor device, comprising:

(a) preparing a semiconductor substrate including a substrate, a first insulating film formed over the substrate, and a semiconductor layer formed over the first insulating film;
(b) forming an optical waveguide including the semiconductor layer over the first insulating film by patterning the semiconductor layer;
(c) forming a second insulating film covering the optical waveguide over the first insulating film;
(d) forming a first groove and a second groove deeper than the first groove over the second insulating film;
(e) after the (d), sequentially forming a barrier film and a conductive film over the second insulating film; and
(f) removing the conductive film and the barrier film outside the first groove and the second groove to form a wiring part in the second groove and form a thin film part having a smaller thickness than the wiring part in the first groove, the thin film part being integrated with the wiring part,
wherein the first groove is arranged above the optical waveguide.

11. The method of manufacturing the semiconductor device according to claim 10,
wherein the thin film part is a heater.

12. The method of manufacturing the semiconductor device according to claim 10,
wherein the wiring part includes a laminated film of the barrier film and the conductive film, and
wherein the thin film part includes the barrier film.

13. The method of manufacturing the semiconductor device according to claim 10,
wherein the wiring part and the thin film part respectively include a laminated film of the barrier film and the conductive film, and
wherein the conductive film included in the thin film part has a smaller thickness than the conductive film included in the wiring part.

14. The method of manufacturing the semiconductor device according to claim 10,
wherein the second insulating film includes a laminated film of a third insulating film and a fourth insulating film, the third insulating film being formed over the first insulating film such that the third insulating film covers the optical waveguide, the fourth insulating film being formed over the third insulating film, and
wherein in the (d), the first groove and the second groove are formed over the fourth insulating film.

15. The method of manufacturing the semiconductor device according to claim 14,
wherein the first insulating film and the third insulating film are formed of silicon oxide, and
wherein the fourth insulating film is formed of a material having a lower relative permittivity than silicon oxide.

16. The method of manufacturing the semiconductor device according to claim 14, further comprising:
(g) after the (c), forming a fifth insulating film over the fourth insulating film before the (d),
wherein in the (f), the fifth insulating film is removed when the conductive film and the barrier film are removed outside the first groove and the second groove.

17. The method of manufacturing the semiconductor device according to claim 16,
wherein the fifth insulating film is formed of silicon oxide.

18. The method of manufacturing the semiconductor device according to claim 10,
wherein the second groove is formed after the first groove is formed.

19. The method of manufacturing the semiconductor device according to claim 10,
wherein the first groove is formed after the second groove is formed.

20. The method of manufacturing the semiconductor device according to claim 10,
wherein the (d) comprises:
(d-1) forming the first groove by etching the second insulating film with a first photoresist film serving as a mask; and
(d-2) forming the second groove by etching the second insulating film with a second photoresist film serving as a mask,
wherein the (d-2) is performed before or after the (d-1).

* * * * *